US010861827B2

(12) United States Patent
Chen et al.

(10) Patent No.: US 10,861,827 B2
(45) Date of Patent: Dec. 8, 2020

(54) 3D PACKAGE STRUCTURE AND METHODS OF FORMING SAME

(71) Applicant: Taiwan Semiconductor Manufacturing Company, Ltd., Hsinchu (TW)

(72) Inventors: Meng-Tse Chen, Changzhi Township (TW); Chung-Shi Liu, Hsinchu (TW); Chih-Wei Lin, Zhubei (TW); Hui-Min Huang, Taoyuan (TW); Hsuan-Ting Kuo, Taichung (TW); Ming-Da Cheng, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/397,479

(22) Filed: Apr. 29, 2019

(65) Prior Publication Data

US 2019/0273068 A1 Sep. 5, 2019

Related U.S. Application Data

(62) Division of application No. 14/755,798, filed on Jun. 30, 2015, now Pat. No. 10,276,541.

(51) Int. Cl.
*H01L 23/02* (2006.01)
*H01L 25/065* (2006.01)
(Continued)

(52) U.S. Cl.
CPC ........ *H01L 25/0657* (2013.01); *H01L 21/565* (2013.01); *H01L 21/568* (2013.01);
(Continued)

(58) Field of Classification Search
CPC . H01L 25/0657; H01L 21/565; H01L 21/568; H01L 21/76804; H01L 21/7684;
(Continued)

(56) References Cited

U.S. PATENT DOCUMENTS 5,497,033 A * 3/1996 Fillion .................. H01L 21/568 257/700
5,870,289 A 2/1999 Tokuda et al.
(Continued)

FOREIGN PATENT DOCUMENTS

CN 103915413 A 7/2014
KR 20140027800 A 3/2014
(Continued)

*Primary Examiner* — Nitin Parekh
(74) *Attorney, Agent, or Firm* — Slater Matsil, LLP

(57) ABSTRACT

An embodiment is method including forming a first die package over a carrier substrate, the first die package comprising a first die, forming a first redistribution layer over and coupled to the first die, the first redistribution layer including one or more metal layers disposed in one or more dielectric layers, adhering a second die over the redistribution layer, laminating a first dielectric material over the second die and the first redistribution layer, forming first vias through the first dielectric material to the second die and forming second vias through the first dielectric material to the first redistribution layer, and forming a second redistribution layer over the first dielectric material and over and coupled to the first vias and the second vias.

20 Claims, 34 Drawing Sheets

(51) Int. Cl.
*H01L 21/56* (2006.01)
*H01L 25/00* (2006.01)
*H01L 21/768* (2006.01)
*H01L 23/31* (2006.01)
*H01L 23/538* (2006.01)
*H01L 23/00* (2006.01)

(52) U.S. Cl.
CPC .... *H01L 21/7684* (2013.01); *H01L 21/76804* (2013.01); *H01L 21/76883* (2013.01); *H01L 23/3128* (2013.01); *H01L 23/5389* (2013.01); *H01L 24/19* (2013.01); *H01L 24/20* (2013.01); *H01L 25/0652* (2013.01); *H01L 25/50* (2013.01); *H01L 2224/04105* (2013.01); *H01L 2224/12105* (2013.01); *H01L 2224/18* (2013.01); *H01L 2224/24226* (2013.01); *H01L 2224/32225* (2013.01); *H01L 2224/73267* (2013.01); *H01L 2224/92244* (2013.01); *H01L 2225/06524* (2013.01); *H01L 2225/06548* (2013.01); *H01L 2225/06586* (2013.01)

(58) Field of Classification Search
CPC ........... H01L 21/76883; H01L 23/3128; H01L 23/5389; H01L 25/0652; H01L 2224/04105; H01L 2224/12105; H01L 2224/24226
USPC .......................................................... 257/686
See application file for complete search history.

(56) References Cited

U.S. PATENT DOCUMENTS 6,020,629 A 2/2000 Farnworth et al.
6,020,643 A * 2/2000 Fukuzumi ........... H01L 27/0251 257/296
6,239,496 B1 5/2001 Asada
6,448,661 B1 9/2002 Kim et al.
6,538,210 B2 * 3/2003 Sugaya ................... H01L 21/56 174/258
7,219,715 B2 5/2007 Popovich
7,276,799 B2 10/2007 Lee et al.
7,482,681 B2 * 1/2009 Standing ............ B23K 35/0244 257/678
7,741,194 B2 * 6/2010 Griffiths .................. H01L 24/19 438/458
8,193,604 B2 6/2012 Lin et al.
8,361,842 B2 1/2013 Yu et al.
8,680,647 B2 3/2014 Yu et al.
8,703,542 B2 4/2014 Lin et al.
8,759,964 B2 6/2014 Pu et al.
8,778,738 B1 7/2014 Lin et al.
8,785,299 B2 7/2014 Mao et al.
8,803,306 B1 8/2014 Yu et al.
8,809,996 B2 8/2014 Chen et al.
8,829,676 B2 9/2014 Yu et al.
8,847,376 B2 9/2014 Oganesian et al.
8,877,554 B2 11/2014 Tsai et al.
9,324,626 B2 4/2016 Shen et al.
9,356,006 B2 * 5/2016 Haba ................... H01L 23/5389
9,991,219 B2 * 6/2018 Seol ........................ H01L 24/25
2001/0015485 A1 8/2001 Song et al.
2002/0152610 A1 * 10/2002 Nishiyama .......... H01L 23/5385 29/840
2005/0023659 A1 2/2005 Lee et al.
2005/0046002 A1 3/2005 Lee et al.
2007/0161266 A1 * 7/2007 Nishizawa .............. H01L 24/97 439/69
2009/0115047 A1 5/2009 Haba et al.
2010/0140779 A1 6/2010 Lin et al.
2011/0068459 A1 3/2011 Pagaila et al.
2011/0147911 A1 * 6/2011 Kohl ................... H01L 21/6835 257/686
2011/0291288 A1 12/2011 Wu et al.
2011/0316147 A1 12/2011 Shih et al.
2013/0026468 A1 1/2013 Yoshimuta et al.
2013/0062760 A1 3/2013 Hung et al.
2013/0062761 A1 * 3/2013 Lin ................... H01L 23/49816 257/738
2013/0168848 A1 7/2013 Lin et al.
2013/0307140 A1 11/2013 Huang et al.
2014/0015131 A1 1/2014 Meyer et al.
2014/0183731 A1 7/2014 Lin et al.
2014/0203429 A1 7/2014 Yu et al.
2014/0225222 A1 8/2014 Yu et al.
2014/0252646 A1 9/2014 Hung et al.
2014/0264930 A1 9/2014 Yu et al.
2014/0320376 A1 10/2014 Ozdemir
2014/0360765 A1 * 12/2014 Kiwanami ............. H05K 1/185 174/260
2015/0303174 A1 * 10/2015 Yu ....................... H01L 21/6835 257/712
2016/0329272 A1 * 11/2016 Geissler .............. H01L 23/5384
2017/0271311 A1 9/2017 Lin et al.

FOREIGN PATENT DOCUMENTS

KR 20140086812 A 7/2014
WO 2009048604 A2 4/2009

* cited by examiner

3D PACKAGE STRUCTURE AND METHODS OF FORMING SAME

CROSS-REFERENCE TO RELATED APPLICATIONS

This application is a Divisional of U.S. patent application Ser. No. 14/755,798, filed Jun. 30, 2015, and entitled "3D Package Structure and Methods of Forming Same," which patent application is incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components such as integrated circuit dies may also require smaller packages that utilize less area than packages of the past, in some applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
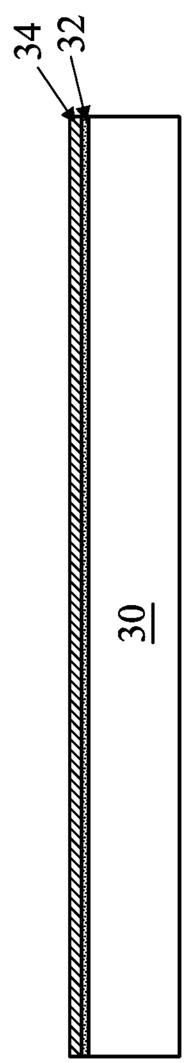
FIGS. 1 through 18 are various intermediate structures in forming a package structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to embodiments in a specific context, namely a three dimensional (3D) integrated fan-out (InFO) package device. Other embodiments may also be applied, however, to other electrically connected components, including, but not limited to, package-on-package assemblies, die-to-die assemblies, wafer-to-wafer assemblies, die-to-substrate assemblies, in assembling packaging, in processing substrates, interposers, substrates, or the like, or mounting input components, boards, dies or other components, or for connection packaging or mounting combinations of any type of integrated circuit or electrical component.

FIGS. 1 through 18 are various intermediate structures in forming a package structure in accordance with some embodiments. FIG. 1 illustrates an intermediate step in the formation of a package structure including a carrier substrate 30, an adhesive layer 32 over a carrier substrate 30, and an adhesive layer 34 over the adhesive layer 32. The carrier substrate 30 may be any suitable substrate that provides (during intermediary operations of the fabrication process) mechanical support for the layers over the carrier substrate 30. The carrier substrate 30 may be a wafer including glass, silicon (e.g., a silicon wafer), silicon oxide, metal plate, a ceramic material, or the like.

The adhesive layer 32 may be disposed, for example laminated, on the carrier substrate 30. The adhesive layer 32 may be formed of a glue, such as an ultra-violet (UV) glue which loses its adhesive property when exposed to UV lights, a light-to-heat conversion (LTHC) material which loses its adhesive property when heated, or the like. The adhesive layer 32 may be dispensed as a liquid and cured, may be a laminate film laminated onto the carrier substrate 30, or may be the like. The top surface of the adhesive layer 32 may be leveled and may have a high degree of coplanarity.

The adhesive layer 34 may be disposed, for example laminated, on the adhesive layer 32. The adhesive layer 34 may be any suitable adhesive, such as a die attach film, such as any suitable adhesive, epoxy, UV glue, or the like.

Figure 2:
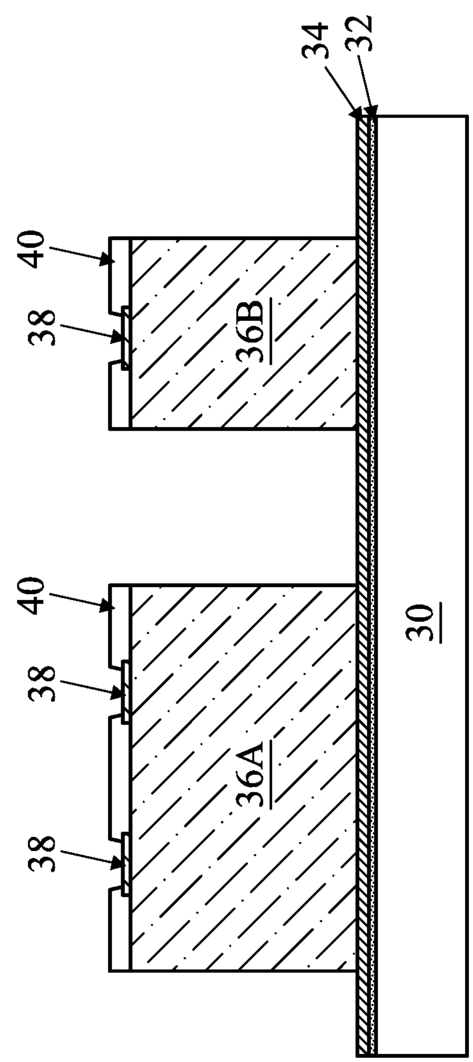

FIG. 2 illustrates the adhering of dies 36 (36A and 36B) to the carrier substrate 30 and the adhesive layer 32 by the adhesive layer 34. The dies 36 include, pads 38 (such as an electrical connector pad), and a passivation layer 40 on an active side of the dies 36. The dies 36 may be, for example, logic integrated circuits, memory dies, analog dies, any other dies, or a combination thereof. The dies 36 may include a semiconductor substrate, such as a bulk semiconductor substrate, semiconductor-on-insulator substrate, or the like, on which active devices, such as transistors, and/or passive devices, such as capacitors, inductors, or the like, are formed according to semiconductor processes. Metallization layers, including a top metallization layer (not shown), may be on the semiconductor substrate and may include interconnect structures to electrically couple devices together and/or to pads 38. The pads 38 are exposed through respective openings in the passivation layer 40.

In an example, the dies 36 may be formed as part of a wafer. The wafer is singulated, such as by dicing or sawing, to form individual dies 36. The dies 36 are placed on the carrier substrate 30 using, for example, a pick-and-place tool. The pads 38 and passivation layer 40 are placed opposite from the carrier substrate 30.

Figure 3:
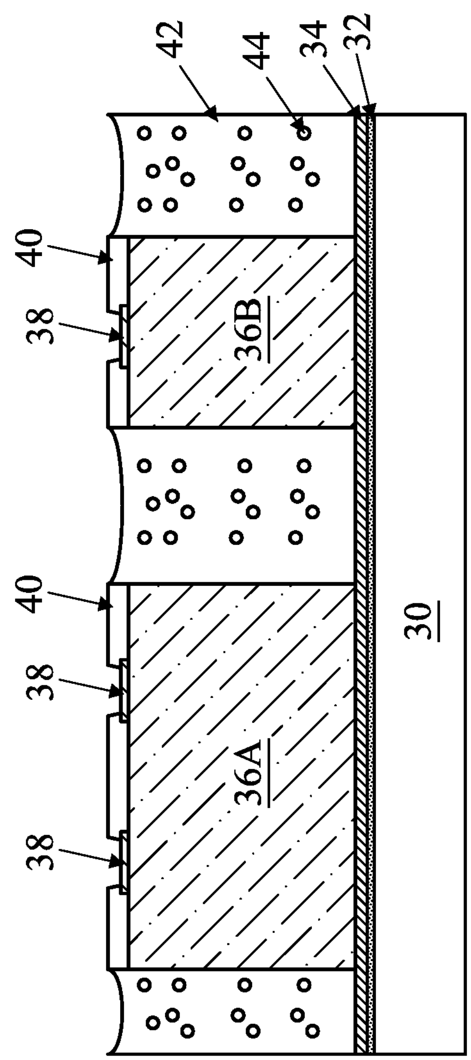

FIG. 3 illustrates the encapsulation of the dies 36. In some embodiments, the dies 36 are encapsulated by a molding material 42. In some embodiments, the molding material includes filler material 44 throughout the molding material. The molding material 42 may be molded on the dies 36, for example, using compression molding. In some embodiments, the molding material 42 is made of a molding compound, a polymer, an epoxy, the like, or a combination thereof. The filler material 44 in the molding material 42 may be silicon oxide filler material or the like. A curing step may be performed to cure the molding material 42, wherein the curing may be a thermal curing, a UV curing, the like, or a combination thereof.

In some embodiments, the dies 36 are buried in the molding material 42, and after the curing of the molding material 42, a planarization step, such as a grinding, is performed on the molding material 42 as illustrated in FIG. 3. The planarization step is used to remove excess portions of the molding material 42, which excess portions are over top surfaces of the passivation layers 40 of the dies 36. In some embodiments, surfaces of the passivation layers 40 and the pads 38 are exposed, and the surfaces of the passivation layers 40 are level with a surface of the molding material 42. The molding material 42 may be described as laterally encapsulating the dies 36.

Figure 4:
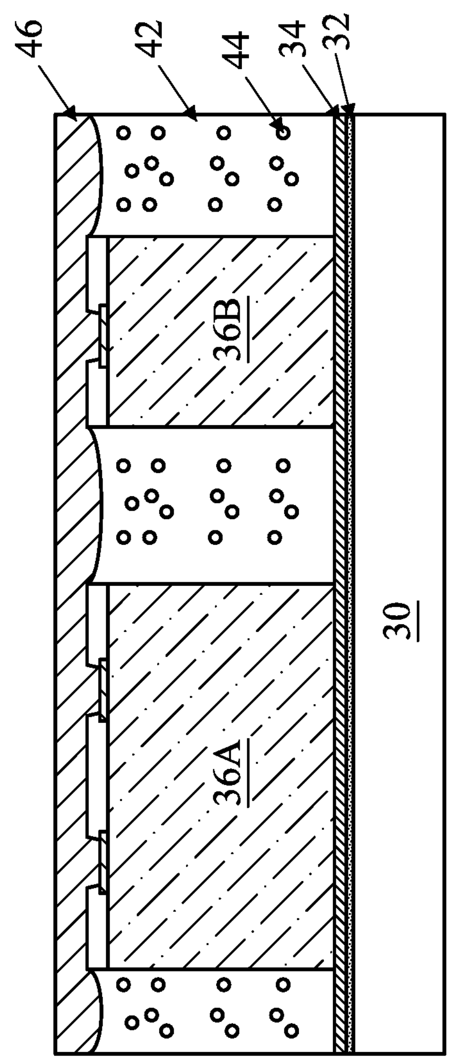

FIG. 4 illustrates the formation of a dielectric material 46 over the active sides of the dies 36, such as on the passivation layers 40. The dielectric material 46 may continuously cover the dies 36 and the molding material 42 and may cover the pads 38. The dielectric material 46 may be a polymer, such as polybenzoxazole (PBO), polyimide, benzocyclobutene (BCB), or the like. In other embodiments, the dielectric material 46 is formed of a nitride such as silicon nitride; an oxide such as silicon oxide, phosphosilicate glass (PSG), borosilicate glass (BSG), boron-doped phosphosilicate glass (BPSG), or the like; or the like. In some embodiments, the dielectric material 46 is a partially cured polymer that is applied as a dry film with a laminating process. In an embodiment, the dielectric material 46 is less than 50 percent cured when applied and may be subsequently cured. In some embodiments, the degree of curing of the dielectric material 46 is directly related to the amount of cross-linking in the dielectric material 46. The dielectric material 46 may be formed by any acceptable deposition process, such as spin coating, chemical vapor deposition (CVD), laminating, the like, or a combination thereof.

In some embodiments, the dielectric material 46 has an uneven top surface, and a planarization step, such as a grinding, is performed on the dielectric material 46. The planarization step is used to provide a planar top surface for the dielectric material 46.

Figure 5:
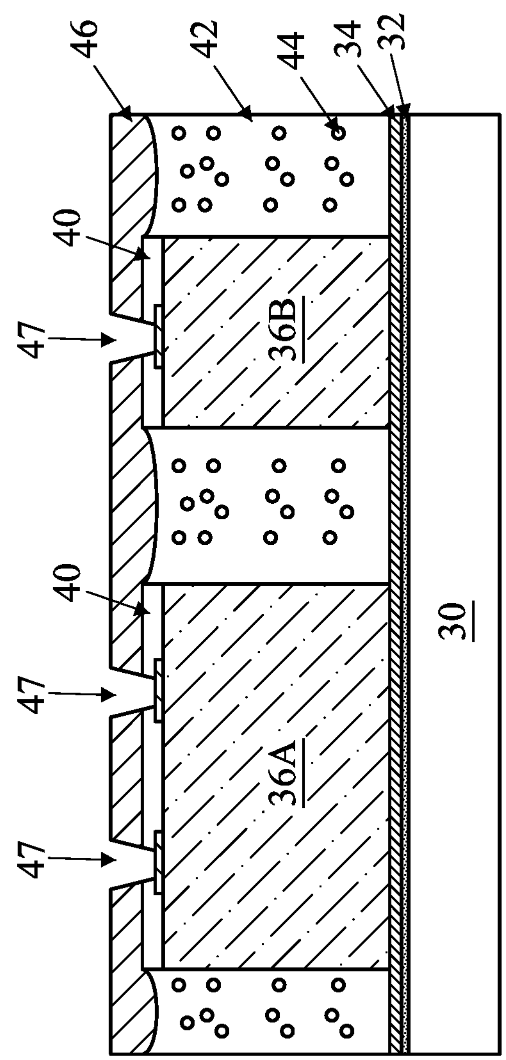

FIG. 5 illustrates the formation of openings 47 through the dielectric material 46 and the passivation layers 40 (if openings not already formed through the passivation layers 40) to expose portions of the pads 38. The openings 47 may be referred to as via openings. The openings 47 may be formed by, for example, etching, milling, laser techniques, the like, or a combination thereof.

Figure 6:
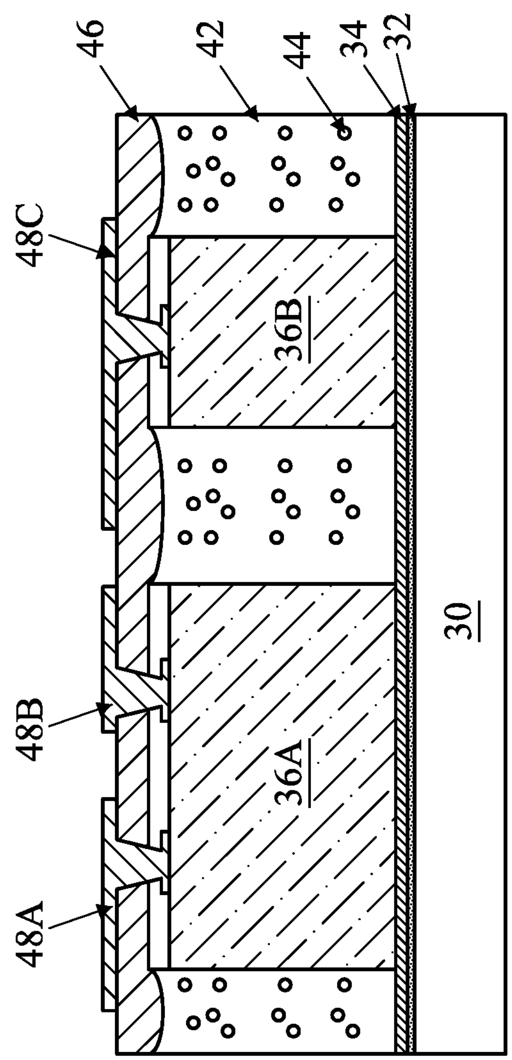

FIG. 6 illustrates the formation of conductive patterns 48 (48A, 48B, and 48C) over the dielectric material 46 and in the openings 47 to the pads 38. The conductive patterns 48 include various traces and/or vias, such as vias in the openings 47. The conductive patterns 48 may be referred to as a redistribution layer 48. The conductive patterns 48, in an example, include a metal such as copper, titanium, the like, or a combination thereof, formed by a plating process, such as electroless plating, electroplating, or the like. For example, a seed layer (not shown) is deposited over the dielectric material 46 and in the openings 47. The seed layer can be copper, titanium, the like, or a combination thereof deposited by atomic layer deposition (ALD), sputtering, another physical vapor deposition (PVD) process, or the like. A photoresist is deposited and patterned exposing the pattern for the conductive patterns 48 that is desired, such as by an acceptable photolithography technique. A conductive material, such as copper, aluminum, the like, or a combination thereof, is deposited on the seed layer by electroless plating, electroplating, or the like. The photoresist is removed, such as an appropriate photoresist stripping process. Remaining exposed seed layer portions are removed, such as by a wet or dry etch.

Although only one layer of vias, one dielectric material 46, and one layer of conductive patterns 48 are illustrated in the embodiment, there may be more than the one layer of vias, dielectric material 46, and layer of conductive patterns 48 to form the redistribution layer 48 in some other embodiments. For example, in one embodiment, the process for forming the dielectric material 46, vias, and conductive patterns 48 may be repeated two more times to form a redistribution layer with three layers of conductive material and three dielectric material layers.

Figure 7:
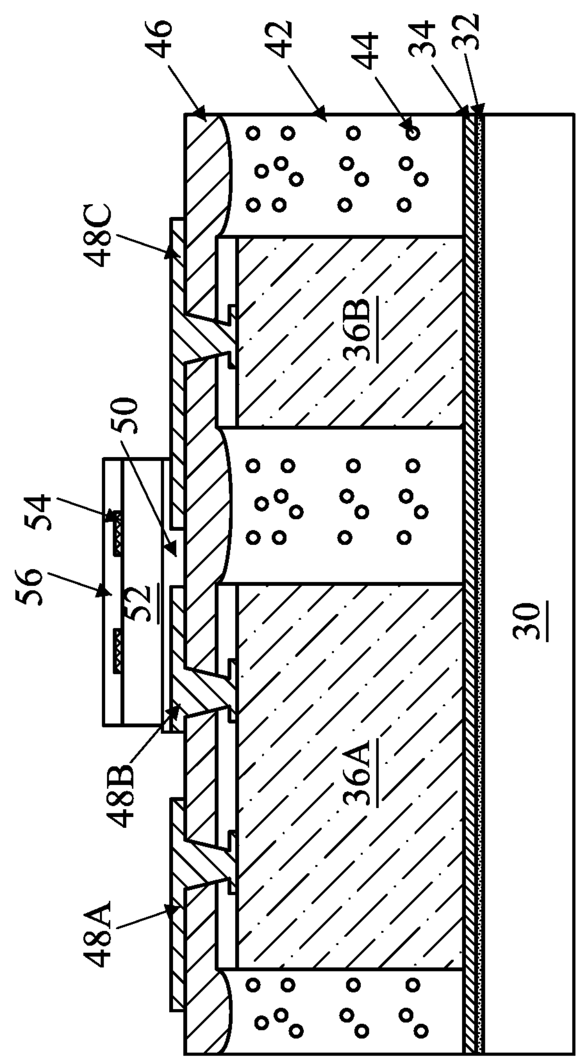

FIG. 7 illustrates the adhering of die 52 to the dielectric material 46 (and possibly one or more of the conductive patterns 48) by an adhesive layer 50. The die 52 include, pads 54 (such as an electrical connector pad), and a passivation layer 56 on an active side of the die 52. The die 52 may be, for example, logic integrated circuits, memory dies, analog dies, any other dies, or a combination thereof. The die 52 may include a semiconductor substrate, such as a bulk semiconductor substrate, semiconductor-on-insulator substrate, or the like, on which active devices, such as transistors, and/or passive devices, such as capacitors, inductors, or the like, are formed according to semiconductor processes. Metallization layers, including a top metallization layer (not shown), may be on the semiconductor substrate and may include interconnect structures to electrically couple devices together and/or to pads 54. The pads 54 may be exposed through respective openings in the passivation layer 56.

In an example, the die 52 may be formed as part of a wafer. The wafer is singulated, such as by dicing or sawing, to form individual dies 52. The die 52 is placed on the dielectric material 46 (and possibly one or more of the conductive patterns 48) using, for example, a pick-and-place tool. The pads 54 and passivation layer 56 are placed opposite from the dielectric material 46.

Figure 8:
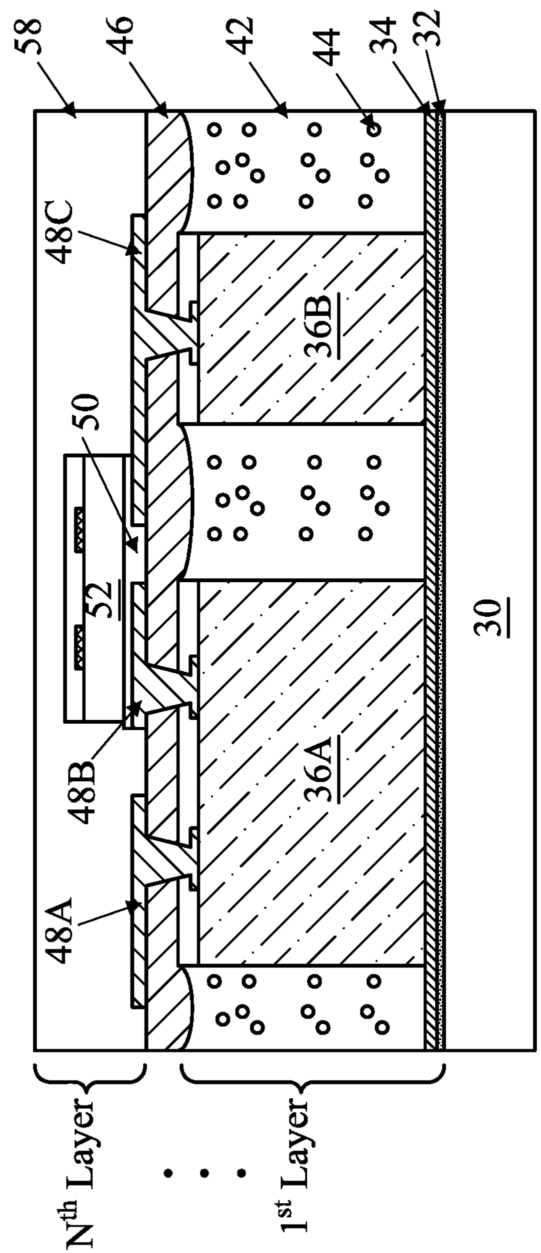

FIG. 8 illustrates the formation of a dielectric material 58 over the conductive patterns 48, the dielectric material 46, and the die 52. The dielectric material 58 laterally encapsulates the die 52. As shown, the dielectric material 58 continuously extends from a region disposed laterally from the die 52 to a region disposed directly above the die 52. For example, there is no vertical interface (where vertical, as shown, is in a direction perpendicular to a top surface of the die 52) with a different dielectric material near a lateral edge of the die 52, e.g., not directly over pad 54 of the die 52. The dielectric material 58 may be a polymer, such as PBO, polyimide, BCB, or the like. In other embodiments, the dielectric material 58 is formed of a nitride such as silicon nitride; an oxide such as silicon oxide, PSG, BSG, BPSG, or the like; or the like. In some embodiments, the dielectric material 58 is a partially cured polymer that is applied as a dry film with a laminating process. In an embodiment, the dielectric material 58 is less than 50 percent cured when applied and may be subsequently cured. In some embodiments, the degree of curing of the dielectric material 58 is directly related to the amount of cross-linking in the dielectric material 58. The dielectric material 58 may be formed by any acceptable deposition process, such as spin coating, CVD, laminating, the like, or a combination thereof.

In some embodiments, the dielectric material 58 has an uneven top surface, and a planarization step, such as a grinding, is performed on the dielectric material 58. The planarization step is used to provide a planar top surface for the dielectric material 58.

The dies 36 and the molding material 42 may be referred to as a first layer of the structure and the die 52 and the dielectric material 58 may be referred to as an Nth layer, or in this case the second layer. Although only two layers are illustrated in the embodiment, there may be more or less than two layers in the structure. For example, in one embodiment, the $2^{nd}$ layer (illustrated as $N^{th}$) may be repeated two more times to give a total of four layers (i.e. N=4). In another example, only one layer may be in the structure and it may be a structure similar to the Nth layer structure.

Figure 9:
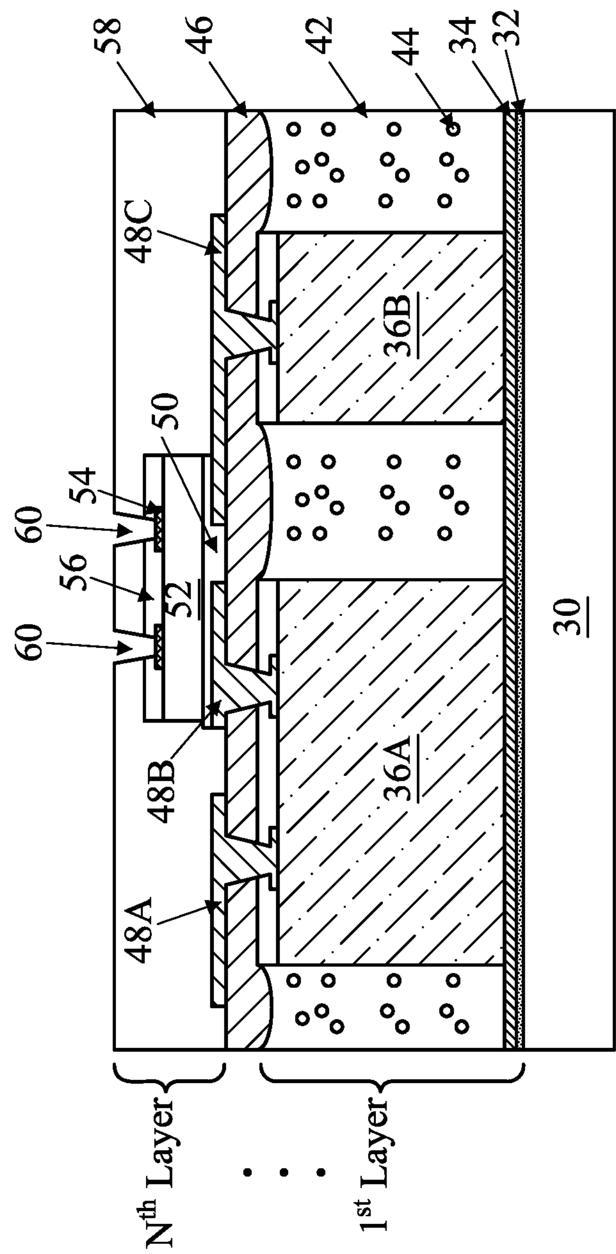

FIG. 9 illustrates the formation of openings 60 through the dielectric material 58 and the passivation layer 56 (if openings not already formed through passivation layer 56) to expose portions of the pads 54. The openings 60 may be referred to as via openings 60. The openings 60 may be formed by, for example, etching, milling, laser techniques, the like, or a combination thereof.

Figure 10:
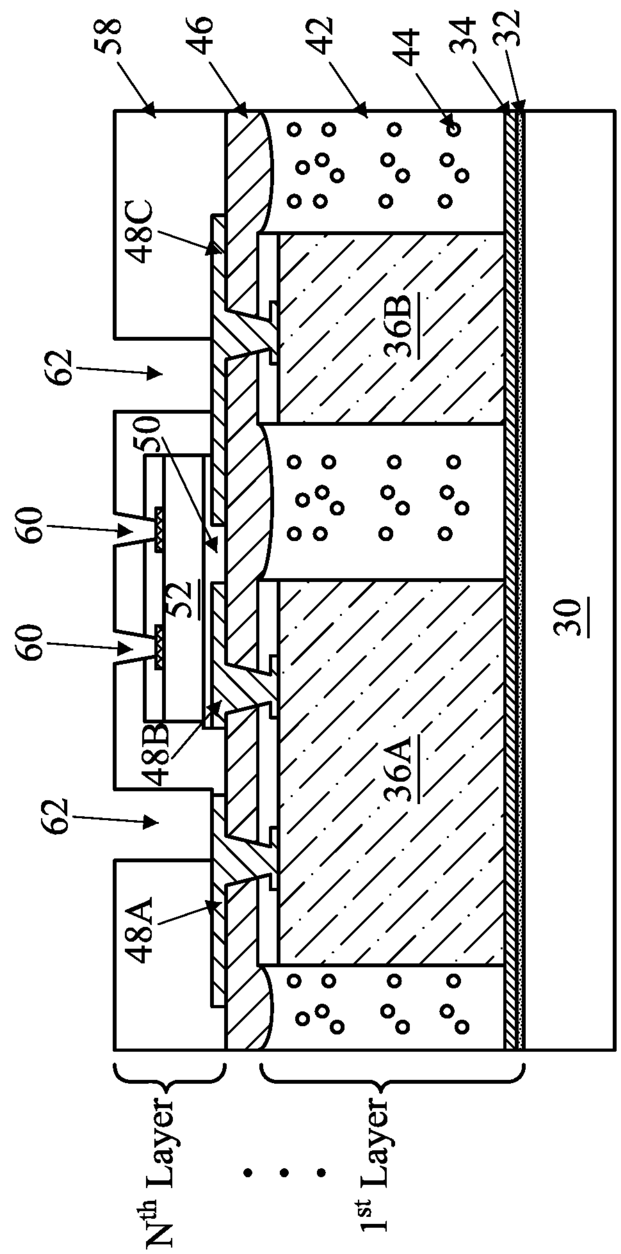

FIG. 10 illustrates the formation through openings 62 through the dielectric material 58 to expose portions of the conductive patterns 48. The openings 62 may be formed by, for example, etching, milling, laser techniques, the like, or a combination thereof.

Figure 11:
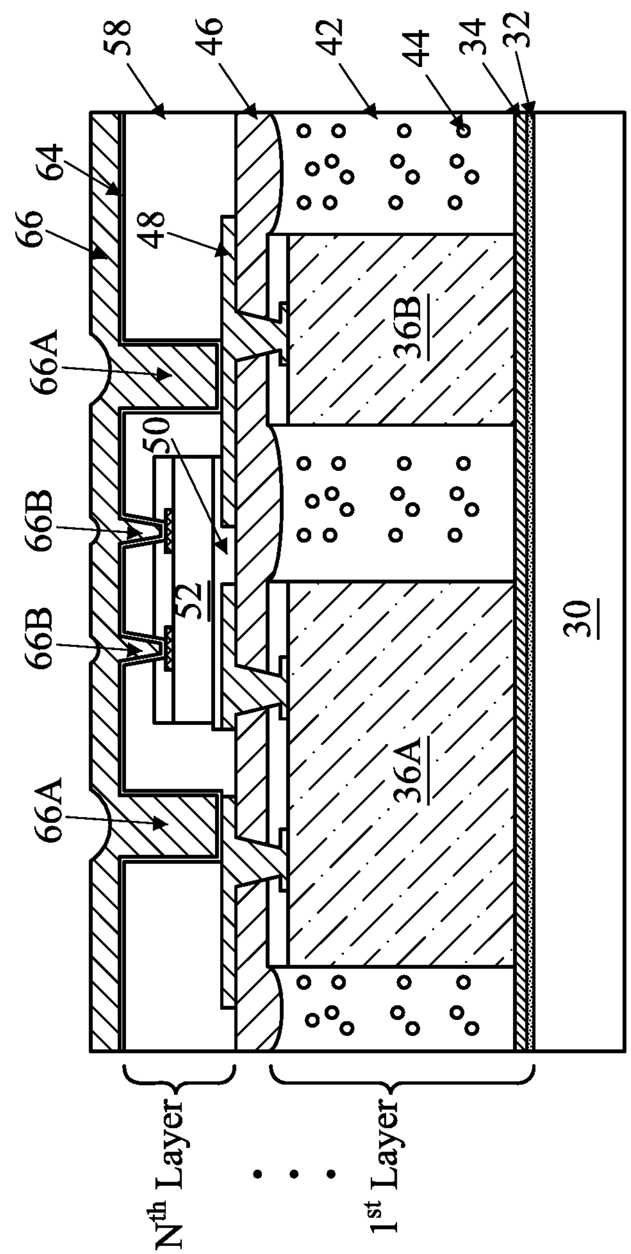

FIG. 11 illustrates the formation of seed layer 64 and conductive material 66 over the dielectric material 58 and in the openings 60 and 62 to the pads 54 and conductive patterns 48, respectively. The conductive material 66 includes via portions 66A and 66B in the openings 62 and 60, respectively. The seed layer 64 may be deposited over the dielectric material 58 and in the openings 60 and 62. The seed layer 64 can be copper, titanium, the like, or a combination thereof deposited by ALD, sputtering, another PVD process, or the like. The conductive material 66, in an example, includes a metal such as copper, titanium, the like, or a combination thereof, formed by a plating process, such as electroless plating, electroplating, or the like. The via portions 66A may be referred to as through package vias (TPVs) and/or through InFO vias (TIVs) and will be referred to as TIVs 66A hereinafter.

Figure 12:
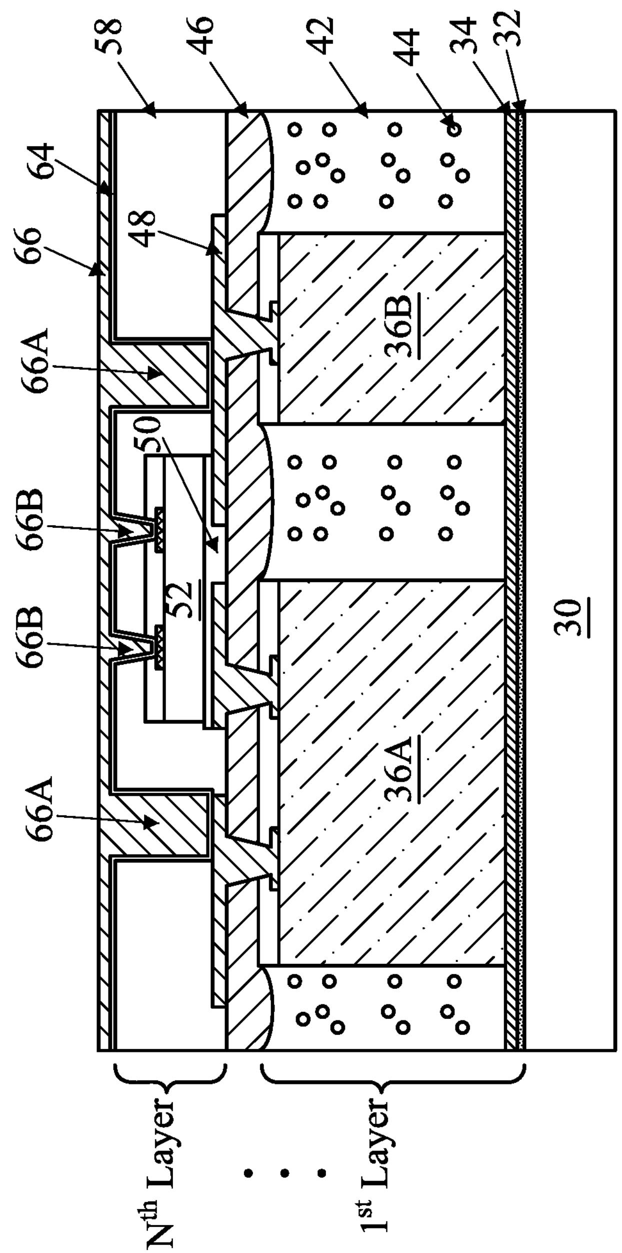

In some embodiments, the conductive material 66 has an uneven top surface, and a planarization step, such as a grinding, is performed on the conductive material 66 as illustrated in FIG. 12. The planarization step is used to provide a planar top surface for the conductive material 66.

Figure 13:
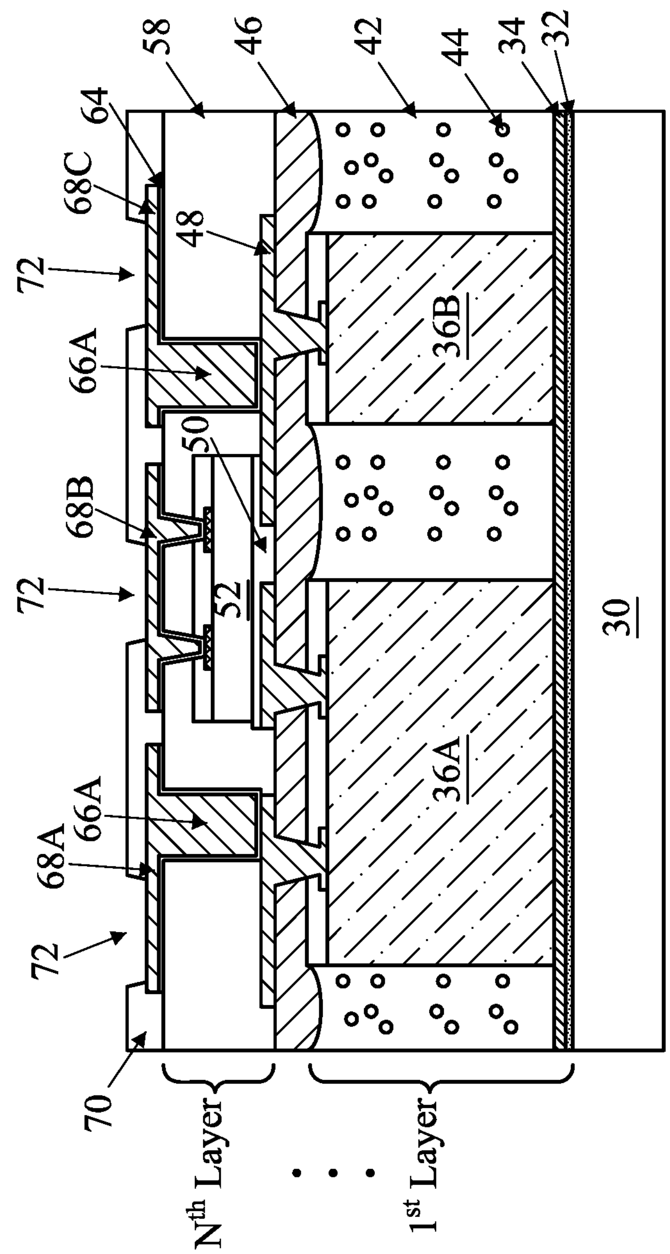

FIG. 13 illustrates the patterning of the conductive material 66 to form conductive patterns 68 (68A, 68B, and 68C), the formation of a dielectric layer 70, and the formation of openings 72 through the dielectric layer 70. The conductive material 66 can be patterned with any acceptable photolithography technique. In one example, a photoresist is deposited and patterned exposing the pattern for the conductive patterns 68 that is desired, such as by an acceptable photolithography technique. The exposed conductive material 66 is then removed with an acceptable etch process to form the separate conductive patterns 68. The conductive patterns 68 may be referred to as a redistribution layer 68. The photoresist is removed, such as an appropriate photoresist stripping process. Remaining exposed seed layer portions are removed, such as by a wet or dry etch. The conductive patterns 68A and 68C each include at least one TIV 66A.

The dielectric layer 70 covers the conductive patterns 68. The dielectric layer 70 may be a polymer, such as PBO, polyimide, BCB, or the like. In other embodiments, the dielectric layer 70 is formed of a nitride such as silicon nitride; an oxide such as silicon oxide, PSG, BSG, BPSG, or the like; or the like. The dielectric layer 70 may be formed by any acceptable deposition process, such as spin coating, CVD, laminating, the like, or a combination thereof. The openings 72 may be formed through the dielectric layer 70 to expose portions of the conductive patterns 68 by, for example, etching, milling, laser techniques, the like, or a combination thereof.

Although only one layer of vias 66B, one dielectric layer 70, and one layer of conductive patterns 68 are illustrated in the embodiment, there may be more than the one layer of vias 66B, dielectric layer 70, and layer of conductive patterns 69 to form the redistribution layer 68 in some other embodiments. For example, in one embodiment, the process for forming the dielectric layer 70, vias 66B, and conductive patterns 68 may be repeated two more times to form a redistribution layer 68 with three layers of conductive material and three dielectric layers.

Figure 14:
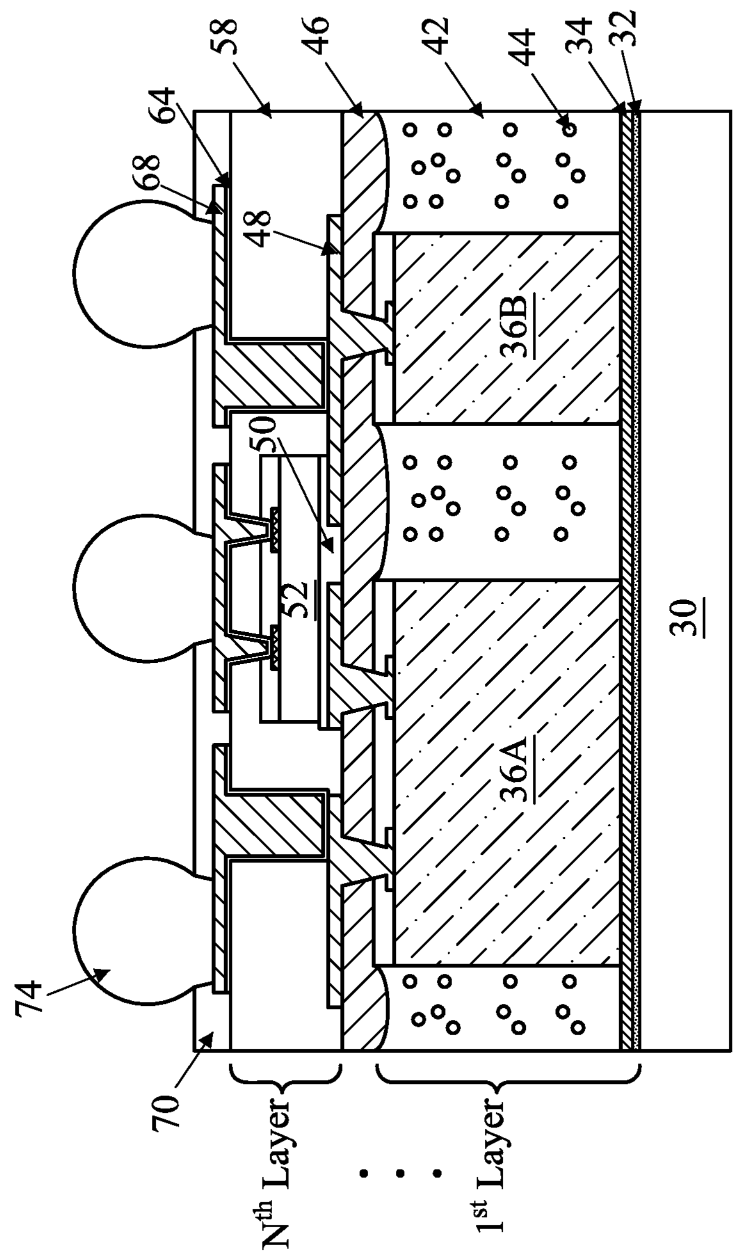

FIG. 14 further illustrates the formation of a set of conductive connectors 74 over and electrically coupled to the conductive patterns 68 through the openings 72. The conductive connectors 74 may be solder bumps, metal pillars, controlled collapse chip connection (C4) bumps, micro bumps, electroless nickel-electroless palladium-immersion gold technique (ENEPIG) formed bumps, or the like. The conductive connectors 74 may include a conductive material such as solder, copper, aluminum, gold, nickel, silver, palladium, tin, the like, or a combination thereof. In an embodiment in which the conductive connectors 74 are solder bumps, the conductive connectors 74 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 74 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors 74. The metal cap layer may include nickel, tin, tin-lead, gold, silver, palladium, indium, nickel-palladium-gold, nickel-gold, the like, or a combination thereof and may be formed by a plating process.

Although not shown, there may be underbump mettalizations (UBMs) coupled to the redistribution layer 68 with the conductive connectors 74 coupled to the UBMs (not shown). The UBMs may extend through the openings 72 in the dielectric layer 70 and also extend along a surface of dielectric layer 70. The UBMs may include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs. Any suitable materials or layers of material that may be used for the UBMs are fully intended to be included within the scope of the current application.

Figure 15:
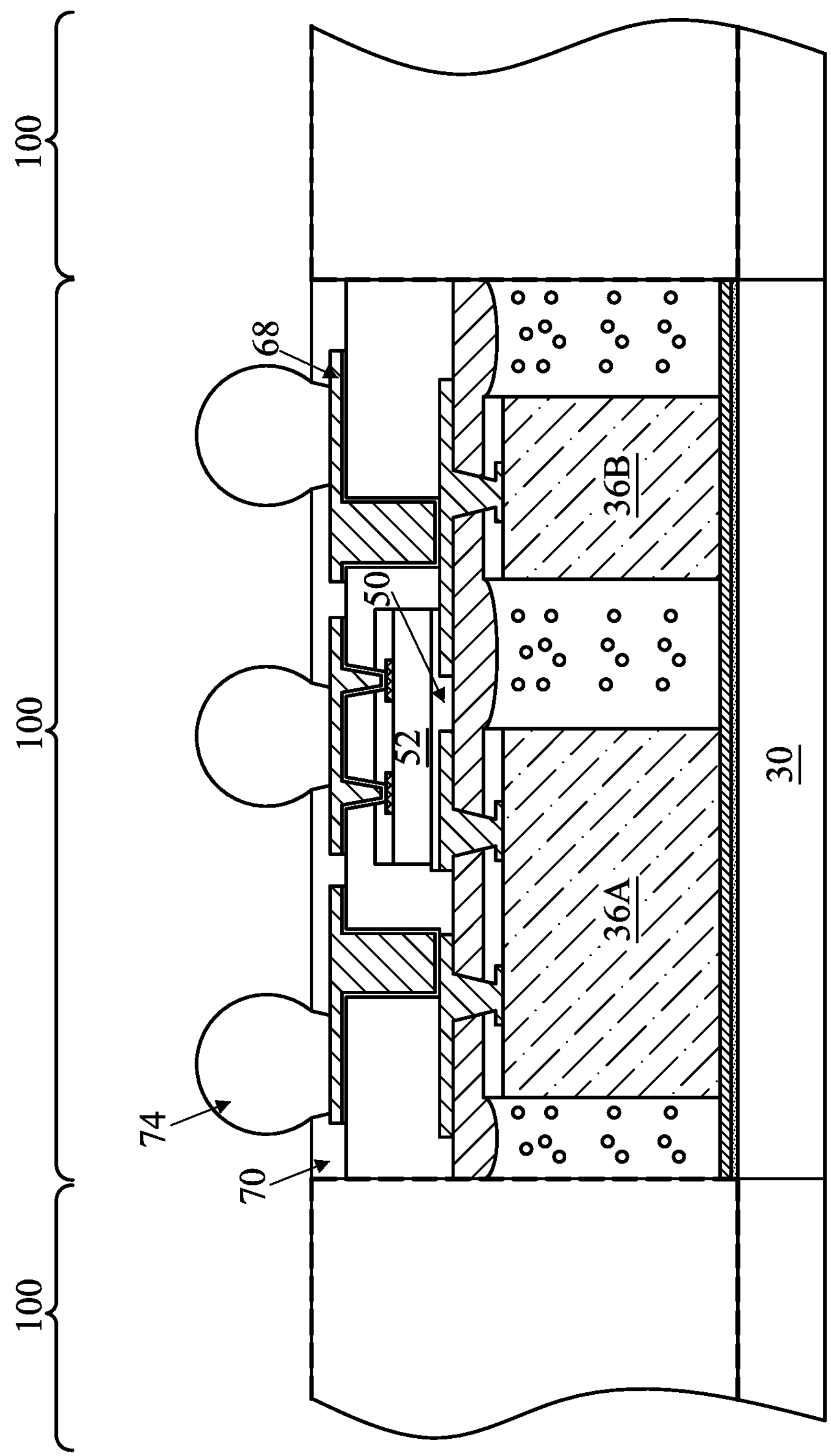

FIG. 15 illustrates that there may be several regions 100 that include the structure that has been previously described in FIGS. 1 through 14 laterally adjoining each other. These regions 100 including their respective structures may be formed on the carrier substrate 30.

Figure 16:
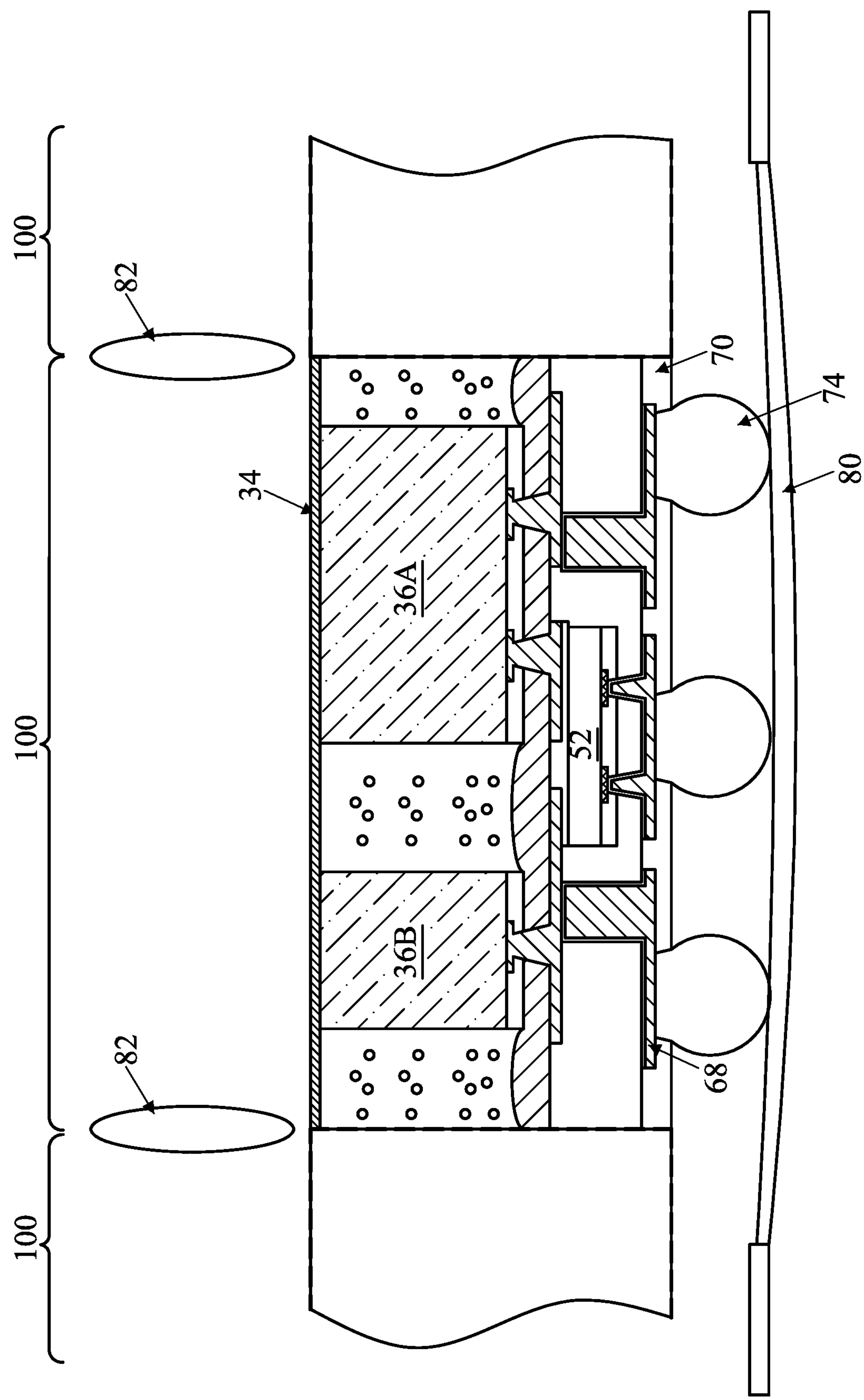

FIG. 16 illustrates a singulation process for singulating the regions 100 into separate structures. Before the singulation process, the carrier substrate 30 and the adhesive layer 32 are removed to expose the adhesive layer 34 according to an embodiment. In this embodiment, the structures are placed on a frame 80 with the conductive connectors 74 adjoining the frame 80 while the carrier substrate 30 and the adhesive layer 32 are removed.

Figure 17:
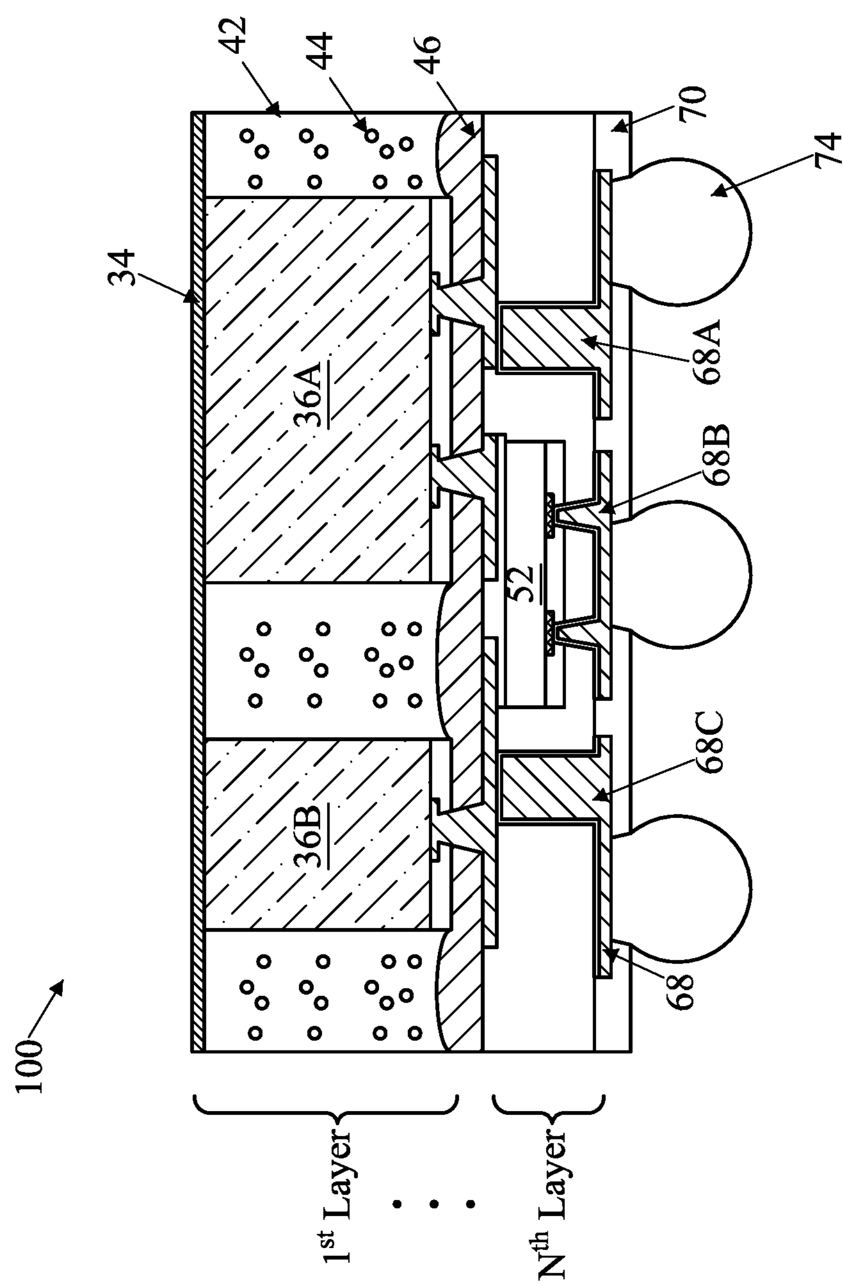

The singulation process is performed by sawing 82 along a scribe line region between the regions 100. The sawing 82 singulates the regions 100 into separate packages 110. FIG. 17 illustrates a resulting, singulated package structure. The singulation results in package 110, which may be from one of the regions 100 in FIG. 16, being singulated.

Figure 18:
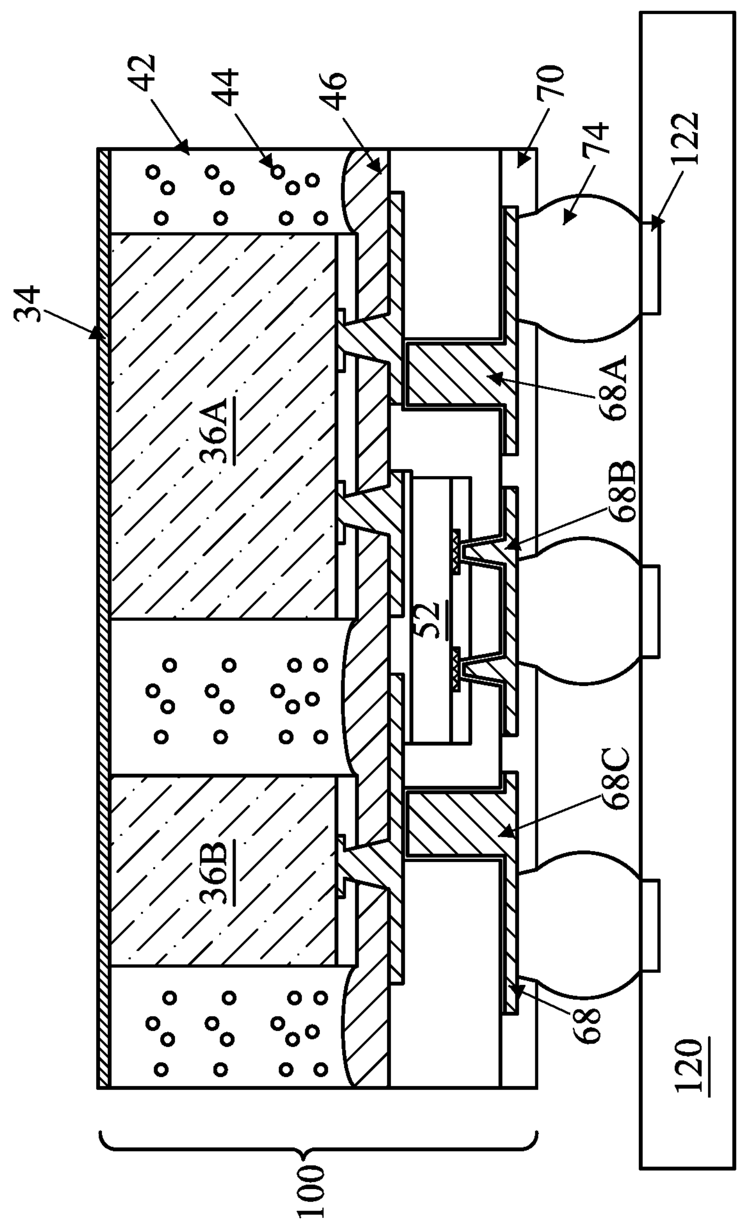

In FIG. 18, the package 110 is attached to a substrate 120. The external conductive connectors 74 are electrically and mechanically coupled to pads 122 on the substrate 120. The substrate 120 can be, for example, a printed circuit board (PCB) or the like.

By encapsulating the die 52 in the laminated dielectric material 58 rather than a molding material with a filler material, the top surface of the dielectric material 58 is free from pits and other imperfections that may be caused by the filler material. For example, if a molding material with a filler material was used, then pits and other imperfections may be formed during a subsequent grinding process of the molding material. However, the laminated dielectric material 58 may not require a grinding process, and even if one is used, will not cause pits or other imperfections. In addition, the formation of the TIVs 66A is combination with the formation of the vias 66B and the conductive patterns 68 to reduce the number of steps and increase the throughput of the process.

FIGS. 19 through 22 are various intermediate structures in forming a package structure in accordance with embodiments that are similar to the previously described embodiment in FIGS. 1 through 18 except in FIGS. 19 through 22, the molding material 42 in the first layer of the structure is replaced with a dielectric material 130. Details regarding this embodiment that are similar to those for the previously described embodiment will not be repeated herein.

Figure 19:
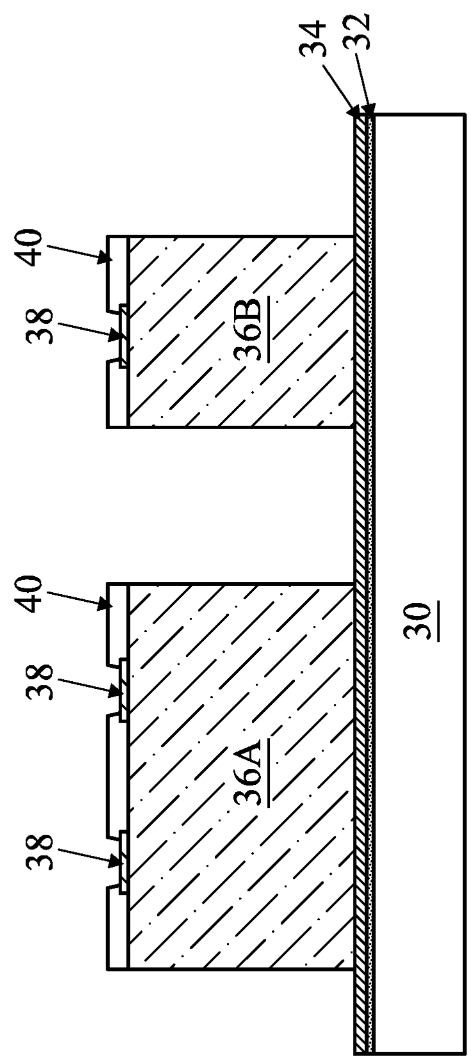
FIGS. 19 through 22 are various intermediate structures in forming a package structure in accordance with some embodiments.
Figure 20:
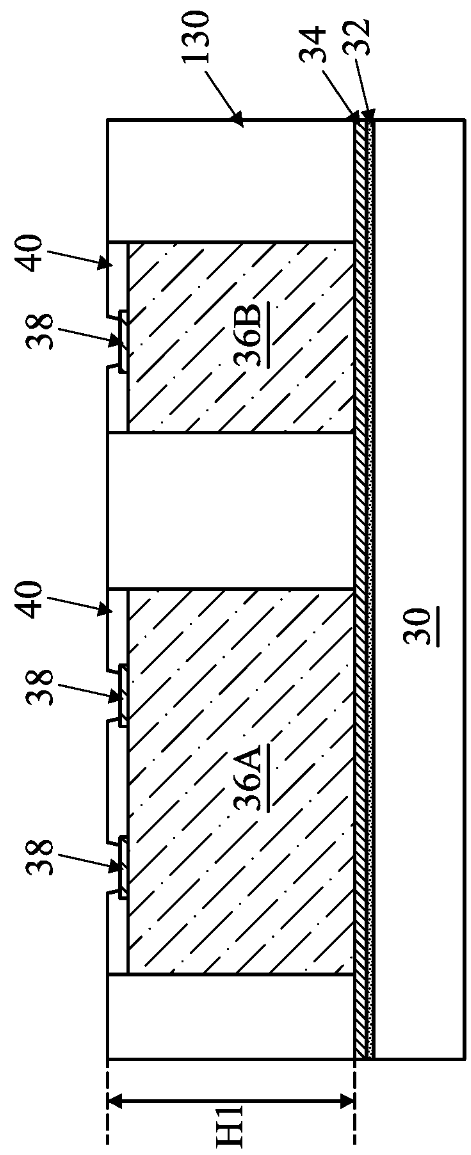

Processing first proceeds as discussed above with respect to FIGS. 1 and 2 to achieve the structure illustrated in FIG. 19. FIG. 20 illustrates the encapsulation of the dies 36 in a dielectric material 130. The dielectric material 130 may be a polymer, such as PBO, polyimide, BCB, or the like. In other embodiments, the dielectric material 58 is formed of a nitride such as silicon nitride; an oxide such as silicon oxide, PSG, BSG, BPSG, or the like; or the like. In some embodiments, the dielectric material 130 is a partially cured polymer that is applied as a dry film with a laminating process. In an embodiment, the dielectric material 130 is less than 50 percent cured when applied and may be subsequently cured. In some embodiments, the degree of curing of the dielectric material 130 is directly related to the amount of cross-linking in the dielectric material 130. The dielectric material 130 may be formed by any acceptable deposition process, such as spin coating, CVD, laminating, the like, or a combination thereof.

In some embodiments, the dies 36 are buried in the dielectric material 130, and after the curing of the dielectric material 130, a planarization step, such as a grinding, is performed on the dielectric material 130 as illustrated in FIG. 20. The planarization step is used to remove excess portions of the dielectric material 130, which excess portions are over top surfaces of the passivation layers 40 of the dies 36. In some embodiments, surfaces of the passivation layers 40 and the pads 38 are exposed, and the surfaces of the passivation layers 40 are level with a surface of the dielectric material 130. The dielectric material 130 may be described as laterally encapsulating the dies 36. In some embodiments, the dielectric material 130 is formed to have a height H1 that is less than or equal to 200 μm, such as about 150 μm.

Figure 21:
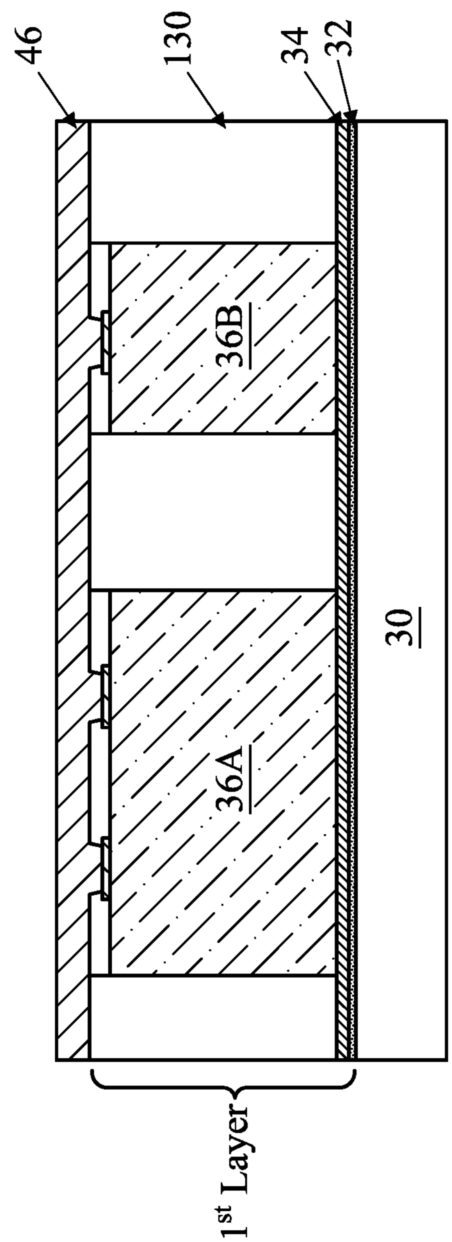

FIG. 21 illustrates the formation of a dielectric material 46 over the active sides of the dies 36, such as on the passivation layers 40. The dielectric material 46 may continuously cover the dies 36 and the dielectric material 130 and may cover the pads 38.

Figure 22:
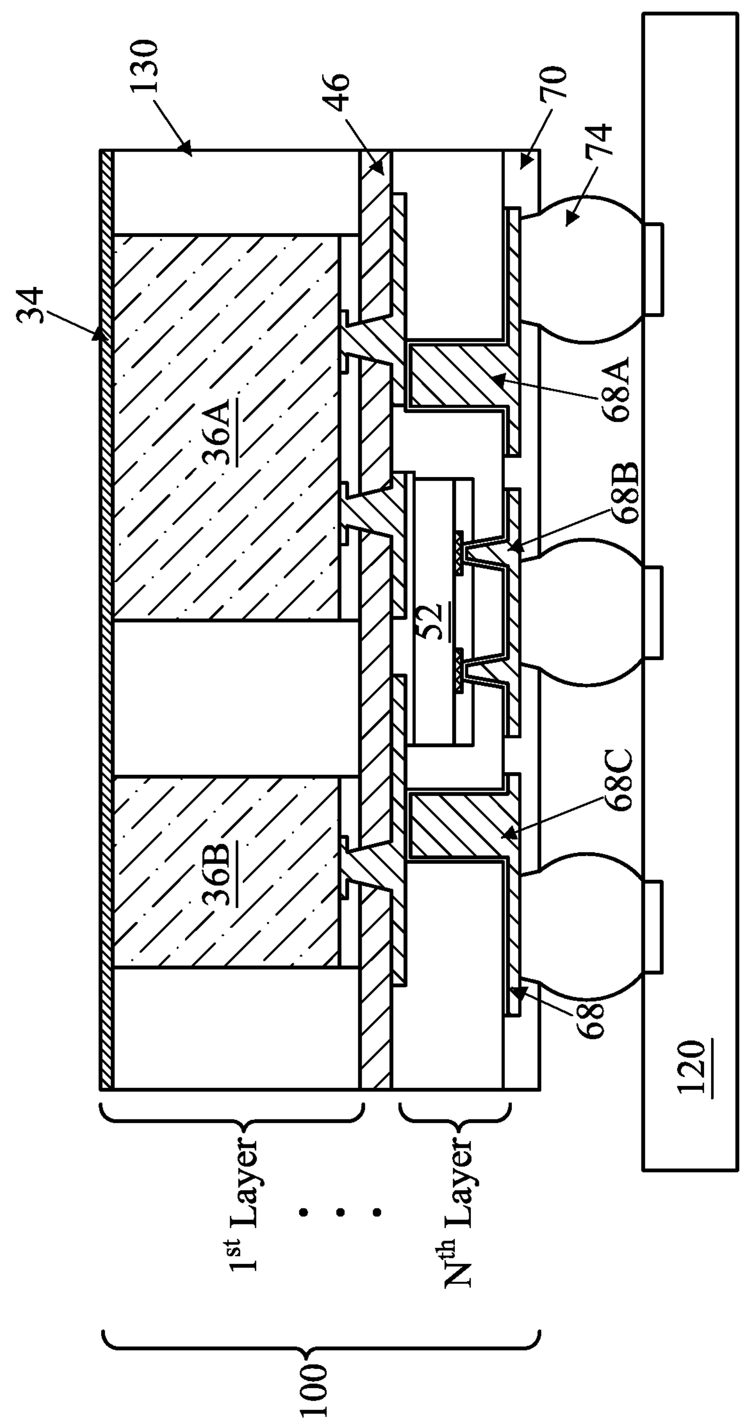

Processing will continue similar to FIGS. 5 through 17 as discussed above to achieve the package 140 illustrated in FIG. 22 which is similar to the package 110 in FIG. 18. In FIG. 22, the package 140 is attached to the substrate 120. The external conductive connectors 74 are electrically and mechanically coupled to pads 122 on the substrate 120. The substrate 120 can be, for example, a PCB or the like.

By encapsulating both the dies 36 and the die 52 in the laminated dielectric material 130 and laminated dielectric material 58, respectively rather than molding materials with filler materials, the top surfaces of the dielectric material are free from pits and other imperfections that may be caused by the filler. For example, if molding materials with filler materials were used, then pits and other imperfections may be formed during a subsequent grinding process of the molding materials. However, the laminated dielectric materials may not require a grinding process, and even if one is used, will not cause pits or other imperfections.

FIGS. 23 through 33 are various intermediate structures in forming a package structure in accordance with embodiments that are similar to the previously described embodiment in FIGS. 1 through 18 except in FIGS. 23 through 33, the TIVs and the vias are formed in separate processes with the TIVs being formed first. Details regarding this embodiment that are similar to those for the previously described embodiment will not be repeated herein.

Figure 23:
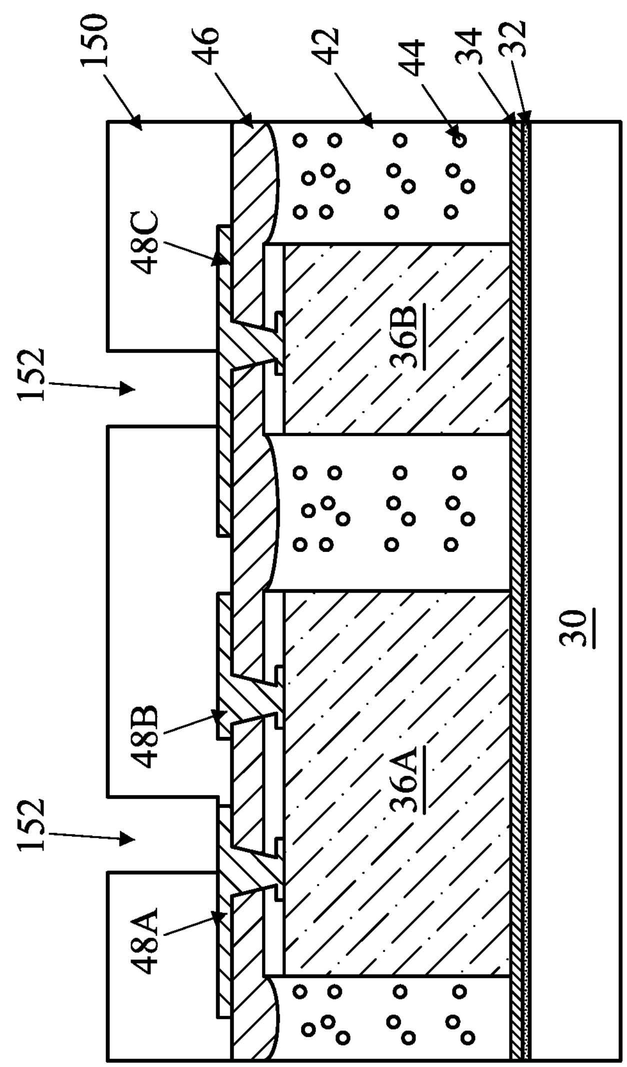
FIGS. 23 through 33 are various intermediate structures in forming a package structure in accordance with some embodiments.

Processing first proceeds as discussed above with respect to FIGS. 1 through 6. In FIG. 23 a mask 150, such as photoresist, is deposited and patterned forming openings 152, such as by an acceptable photolithography technique. The openings 152 will be used to form the TIVs through the Nth layer of the structure.

Figure 24:
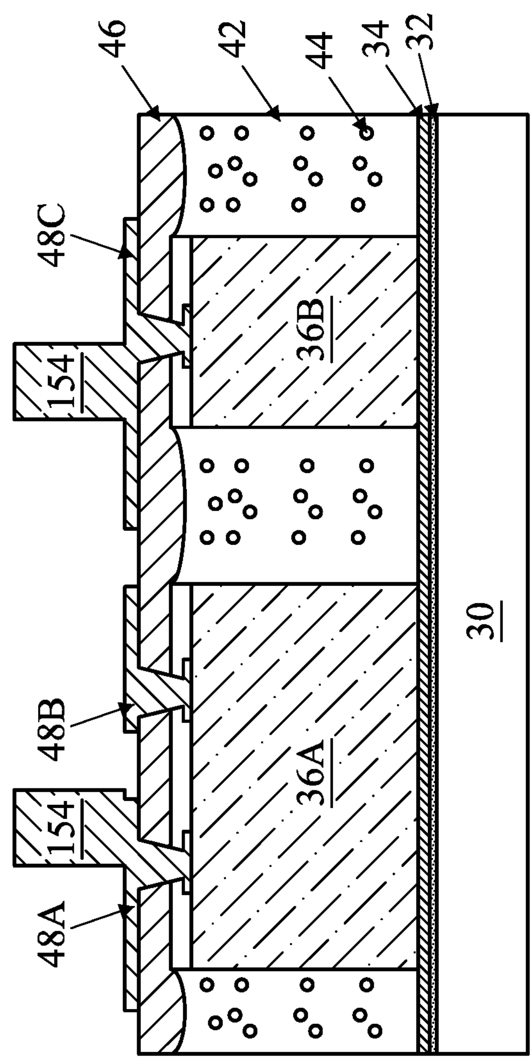

FIG. 24 illustrates the formation of the TIVs 154 in the openings 152 and coupled to at least one of the conductive patterns 48. In the illustrated embodiment, one of the TIVs 154 is coupled to the conductive pattern 48A and one is coupled to the conductive pattern 48C. The TIVs 154, in an example, include a metal such as copper, titanium, the like, or a combination thereof, formed by a plating process, such as electroless plating, electroplating, or the like. For example, a seed layer (not shown) may be in at least the bottoms of the openings 152 and may be formed before or after the mask 150. The seed layer can be copper, titanium, the like, or a combination thereof deposited by ALD, sputtering, another PVD process, or the like. A conductive material, such as copper, aluminum, the like, or a combination thereof, is deposited on the seed layer (if present) by electroless plating, electroplating, or the like. The mask 150 is removed, such as an appropriate process, such as a photoresist stripping process. Remaining exposed seed layer portions are removed, such as by a wet or dry etch to leave the TIVs 154.

Figure 25:
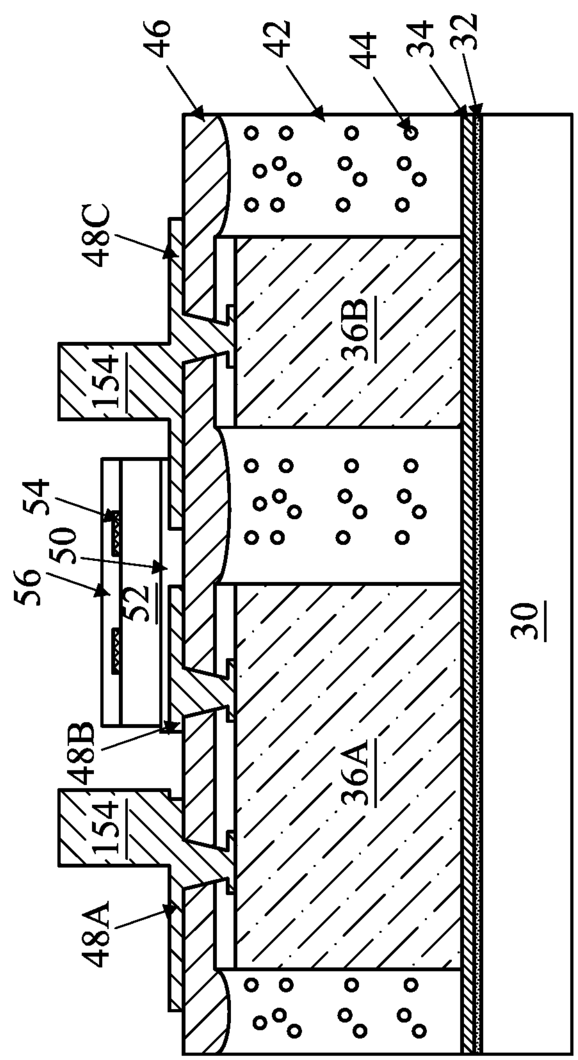

FIG. 25 illustrates the adhering of die 52 to the dielectric material 46 (and possibly one or more of the conductive patterns 48) by an adhesive layer 50. In the illustrated embodiment, the die 52 is adhered between two of the TIVs 154.

Figure 26:
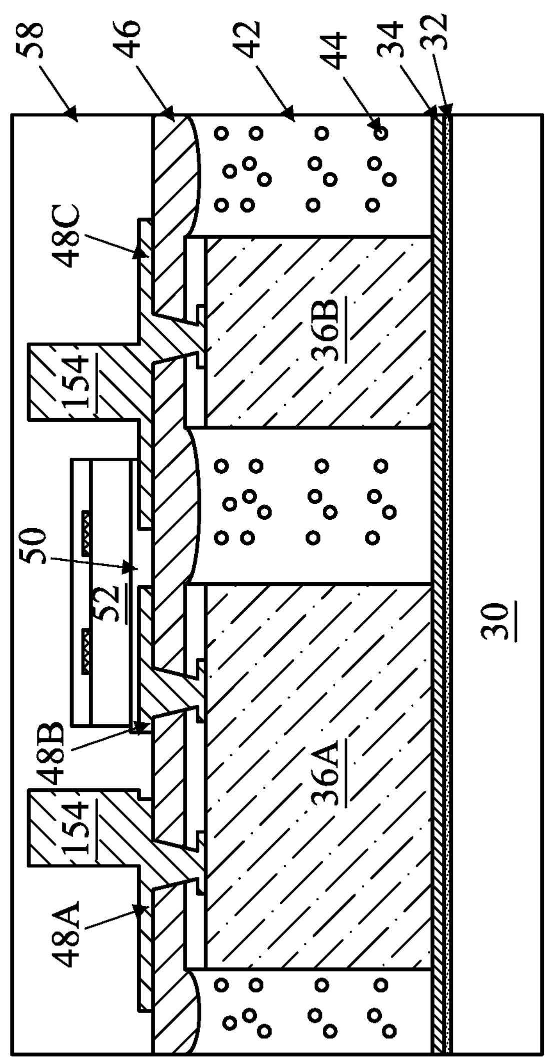

FIG. 26 illustrates the formation of a dielectric material 58 over the conductive patterns 48, the TIVs 154, the dielectric material 46, and the die 52. The dielectric material 58 laterally encapsulates the die 52 and the TIVs 154. As shown, the dielectric material 58 continuously extends from a region disposed laterally from the die 52 and the TIVs 154 to a region disposed directly above the die 52 and the TIVs 154, respectively. For example, there is no vertical interface (where vertical, as shown, is in a direction perpendicular to a top surface of the die 52 and the TIVs 154) with a different dielectric material near a lateral edge of the die 52 and the TIVs 154, e.g., not directly over pad 54 of the die 52 or the top surface of the TIVs 154.

Figure 27:
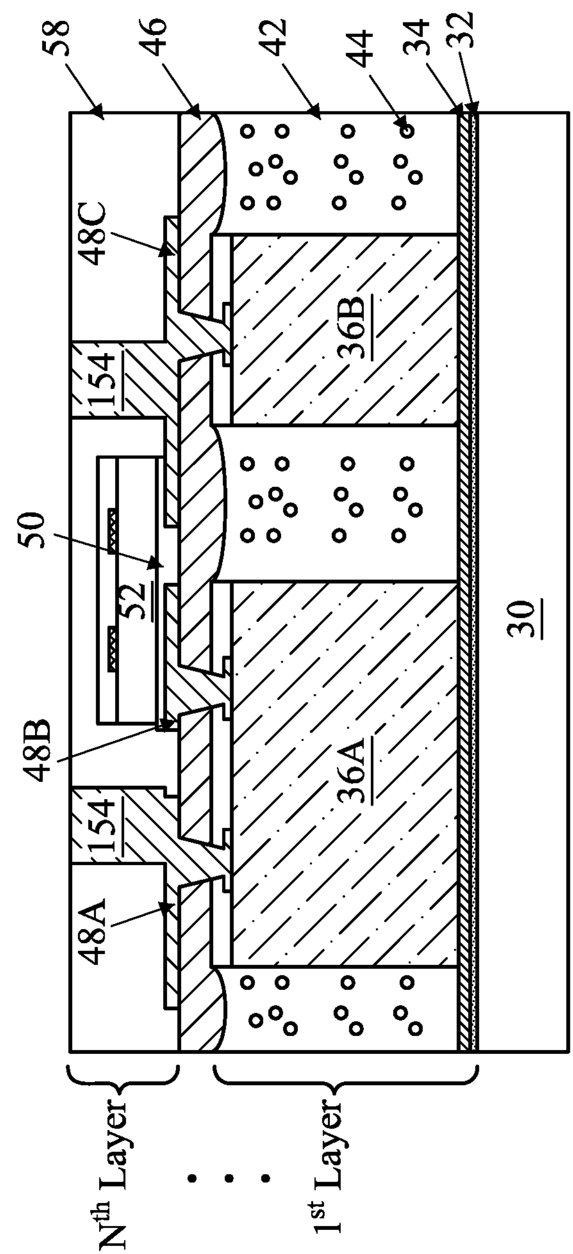

In some embodiments, the TIVs 154 are buried in the dielectric material 58, and after the curing of the dielectric material 58, a planarization step, such as a grinding, is performed on the dielectric material 58 as illustrated in FIG. 27. The planarization step is used to remove excess portions of the dielectric material 58, which excess portions are over top surfaces of the TIVs 154. In some embodiments, surfaces of the TIVs 154 are exposed, and the surfaces of the TIVs 154 are level with a surface of the dielectric material 58. The dielectric material 58 may be described as laterally encapsulating the TIVs 154.

Figure 28:
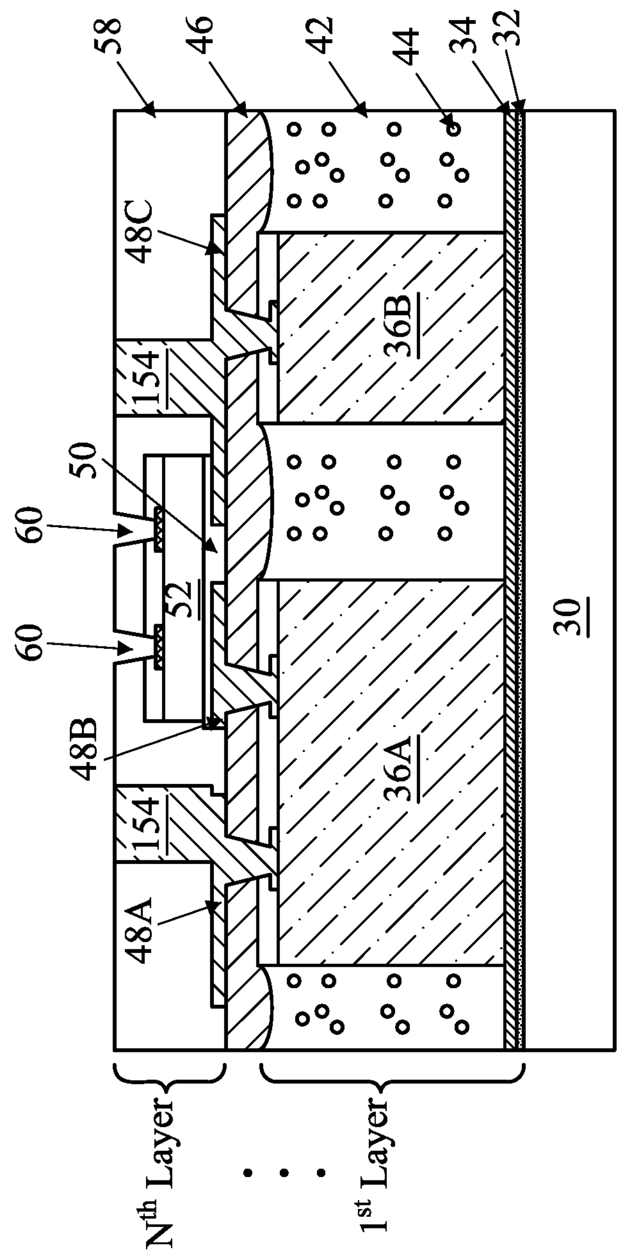

FIG. 28 illustrates the formation of openings 60 through the dielectric material 58 and the passivation layer 56 (if openings not already formed through passivation layer 56) to expose portions of the pads 54. The openings 60 may be referred to as via openings 60. The openings 60 may be formed by, for example, etching, milling, laser techniques, the like, or a combination thereof.

Figure 29:
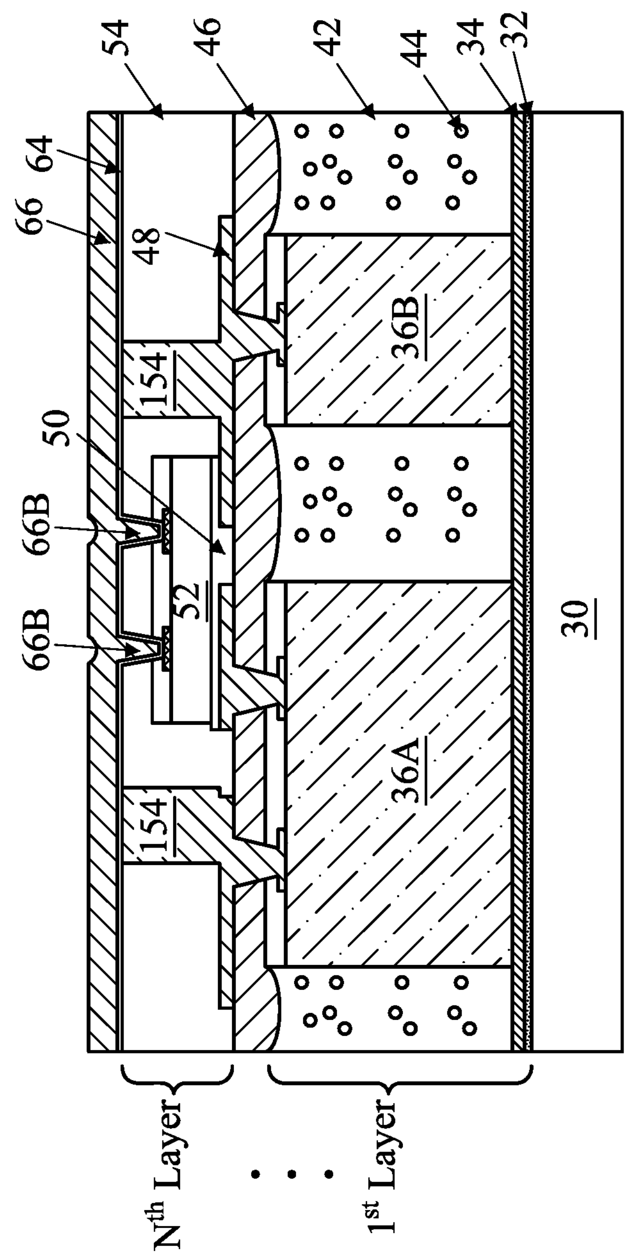

FIG. 29 illustrates the formation of seed layer 64 and conductive material 66 over the dielectric material 58 and the TIVs 154 and in the openings 60 to the pads 54. The seed layer 64 may be deposited over the dielectric material 58 and in the openings 60.

Figure 30:
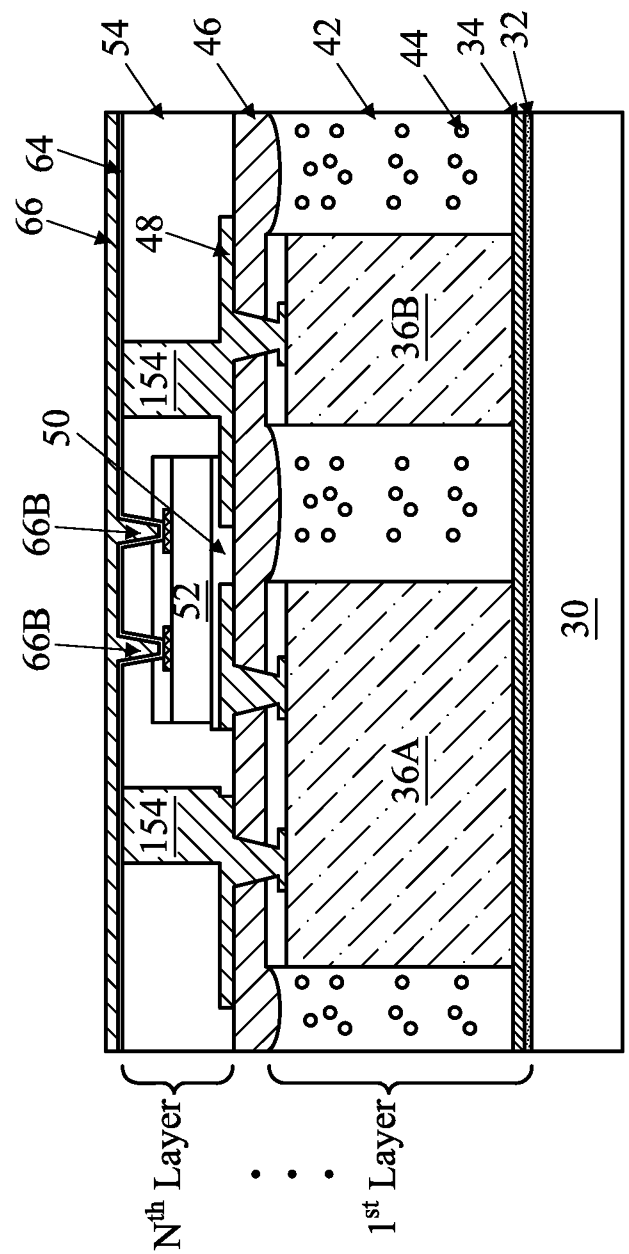
Figure 31:
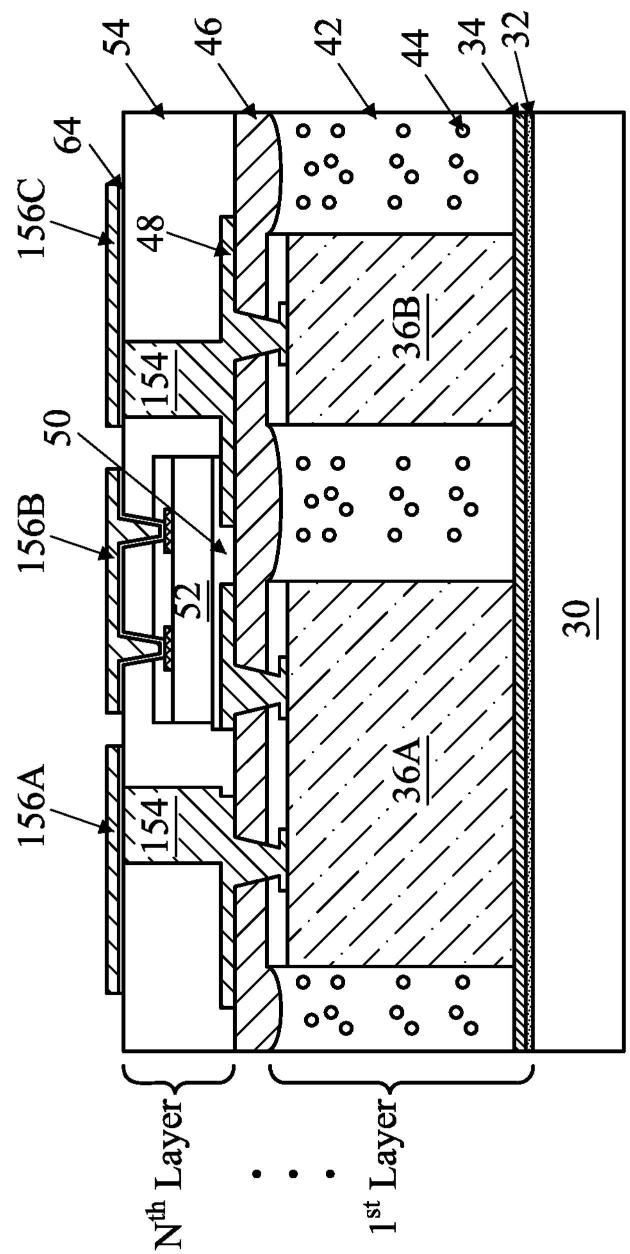

In some embodiments, the conductive material 66 has an uneven top surface, and a planarization step, such as a grinding, is performed on the conductive material 66 as illustrated in FIG. 30. The planarization step is used to provide a planar top surface for the conductive material 66.

FIG. 40 further illustrates the patterning of the conductive material 66 to form conductive patterns 156 (156A, 156B, and 156C). The conductive material 66 can be patterned with any acceptable photolithography technique. In one example, a photoresist is deposited and patterned exposing the pattern for the conductive patterns 68 that is desired, such as by an acceptable photolithography technique. The exposed conductive material 66 is then removed with an acceptable etch process to form the separate conductive patterns 156 which are similar to the conductive patterns 68 described above except that the conductive patterns 156A and 156C do not include via or TIV portions as the TIVs 154 were formed in a separate process. The conductive patterns 156 may be referred to as a redistribution layer 156. The photoresist is removed, such as an appropriate photoresist stripping process. Remaining exposed seed layer portions are removed, such as by a wet or dry etch.

Figure 32:
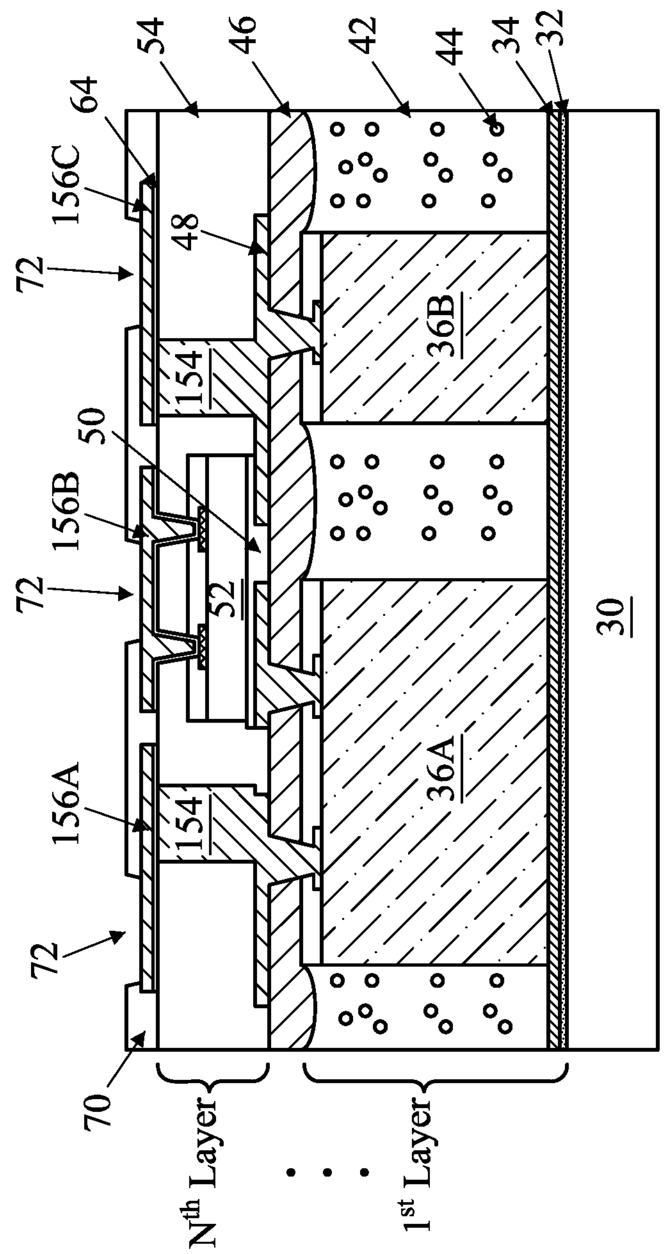

FIG. 32 illustrates the formation of the dielectric layer 70 and the formation of openings 72 through the dielectric layer 70. The dielectric layer 70 covers the conductive patterns 156 with the openings 72 exposing portions of the conductive patterns 156 by, for example, etching, milling, laser techniques, the like, or a combination thereof.

Figure 33:
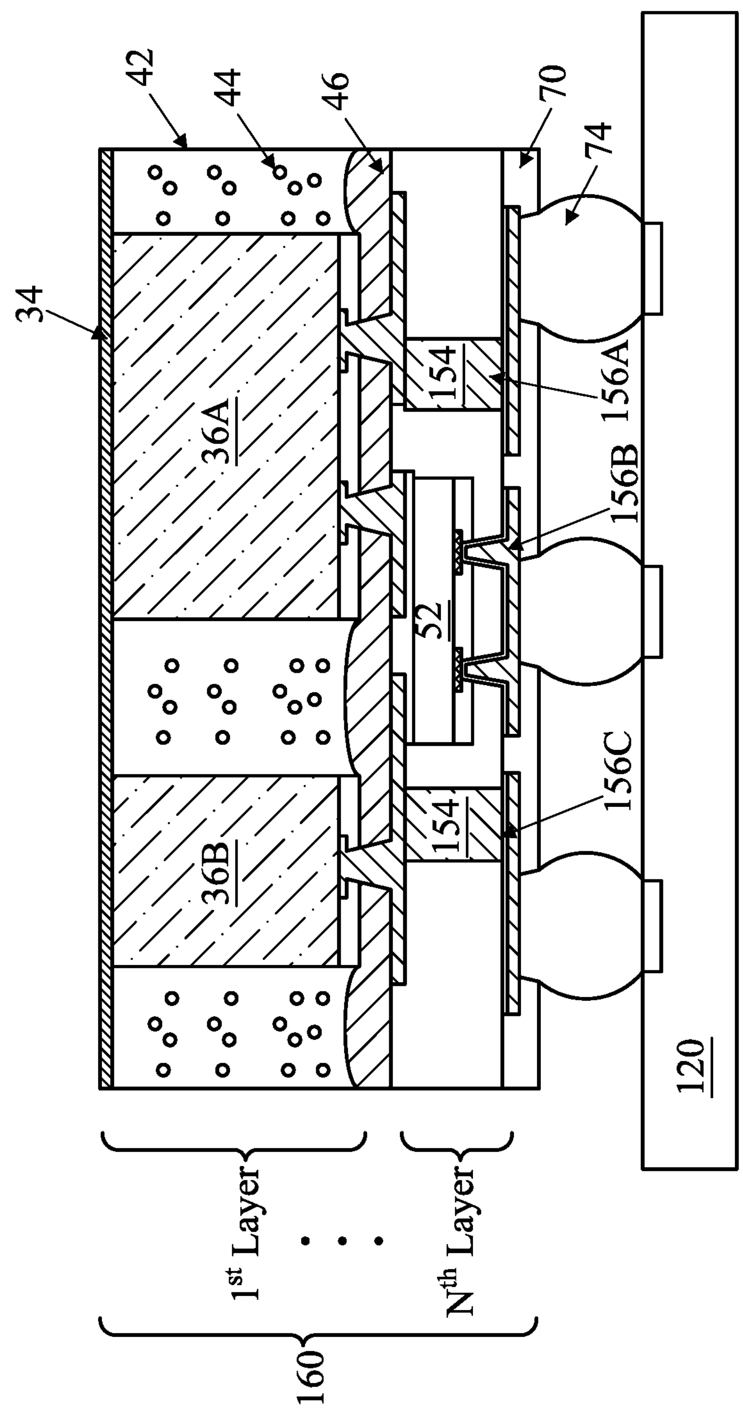

Processing will continue similar to FIGS. 14 through 17 as discussed above to achieve the package 160 illustrated in FIG. 33 which is similar to the package 110 in FIG. 17. In FIG. 33, the package 160 is attached to the substrate 120. The external conductive connectors 74 are electrically and mechanically coupled to pads 122 on the substrate 120. The substrate 120 can be, for example, a PCB or the like.

Figure 34:
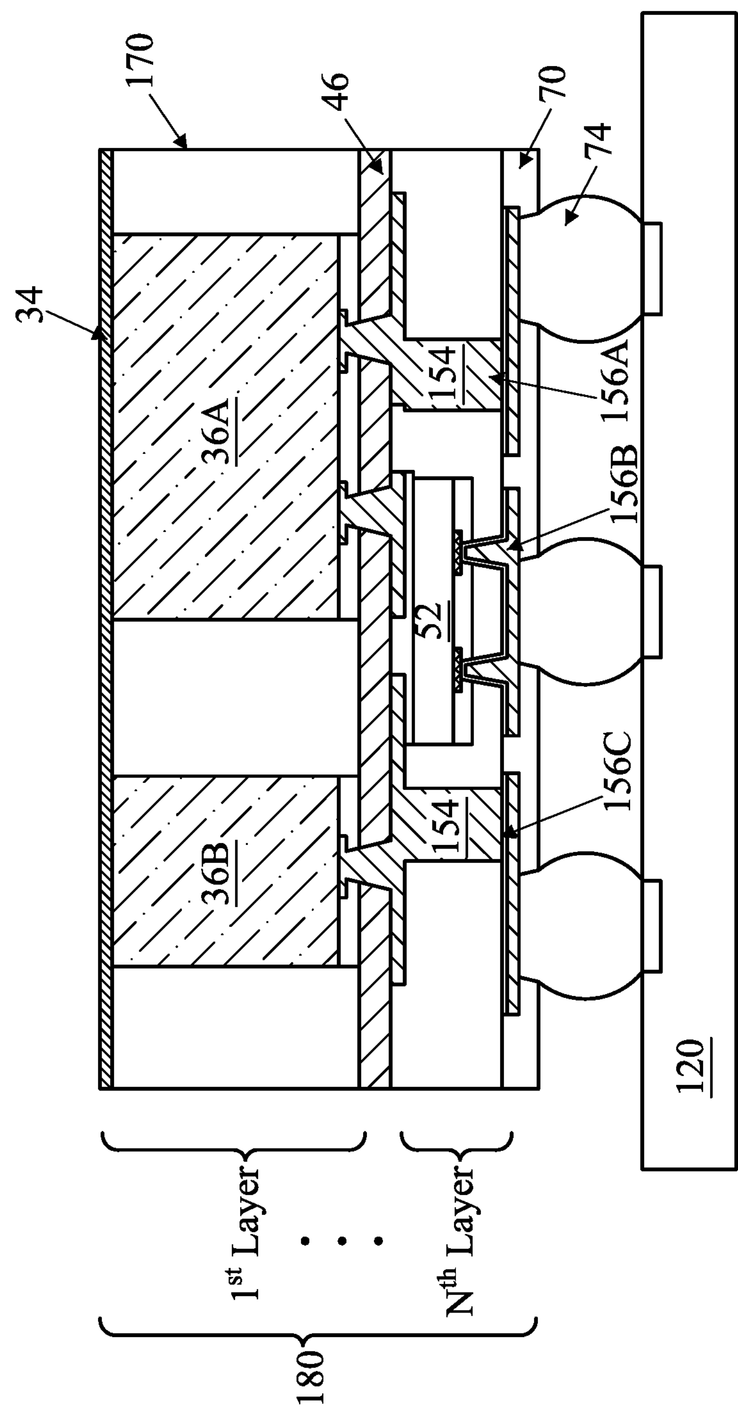
FIG. 34 is a package structure in accordance with some embodiments.

FIG. 34 is a package structure in accordance with embodiments that are similar to the previously described embodiment in FIGS. 23 through 33 except in FIG. 34, the molding material 42 is replaced with dielectric material 170 which is similar to the dielectric material 130 described above in the embodiment in FIGS. 19 through 22. Details regarding this embodiment that are similar to those for the previously described embodiment will not be repeated herein.

By encapsulating one or more of the dies 52 and 36 in the laminated dielectric material rather than a molding material with a filler material, the top surface of the dielectric material is free from pits and other imperfections that may be caused by the filler. For example, if a molding material with a filler material was used, then pits and other imperfections may be formed during a subsequent grinding process of the molding material. However, the laminated dielectric material may not require a grinding process, and even if one is used, will not cause pits or other imperfections. In addition, the formation of the TIVs can be in combination with the formation of other vias and the conductive patterns to reduce the number of steps and increase the throughput of the process.

An embodiment is method including forming a first die package over a carrier substrate, the first die package comprising a first die, forming a first redistribution layer over and coupled to the first die, the first redistribution layer including one or more metal layers disposed in one or more dielectric layers, adhering a second die over the redistribution layer, laminating a first dielectric material over the second die and the first redistribution layer, forming first vias through the first dielectric material to the second die and forming second vias through the first dielectric material to the first redistribution layer, and forming a second redistribution layer over the first dielectric material and over and coupled to the first vias and the second vias.

Another embodiment is a method including adhering backside surfaces of a first die and a second die to a carrier substrate, the first die and the second die having active surfaces opposite of the backside surfaces, the active surfaces including conductive pads, encapsulating at least lateral edges of the first die and the second die with an encapsulant, laminating a first dielectric layer over the active surfaces of the first die and the second die and the encapsulant, forming a first redistribution layer over the first dielectric layer and coupled to the conductive pads of first die and the second die, adhering a backside surfaces of a third die to the first dielectric layer, the third die having an active surface opposite of a backside surface, the active surface including conductive pads, laminating a second dielectric layer over the second die and the first redistribution layer, and forming a second redistribution layer over the second dielectric layer and coupled to the conductive pads of third die and the first redistribution layer.

A further embodiment is a structure including a first die layer including a first die and a second die laterally encapsulated with an encapsulant, the first die and the second die having backside surfaces and active surfaces opposite of the backside surfaces, the active surfaces including conductive pads, a first dielectric layer over the active surfaces of the first die and the second die and over the encapsulant, a first redistribution layer extending along a top surface of the first dielectric layer and extending through the first dielectric layer to contact the conductive pads of the first die and the second die, a second die layer including a third die over the first dielectric layer and the first redistribution layer, the third die being laterally encapsulated with a second dielectric layer, the third die having a backside surface and an active surface opposite of the backside surface, the active surface including conductive pads, and a second redistribution layer extending along a top surface of the second dielectric layer and extending through the second dielectric layer to contact the conductive pads of the third die and the first redistribution layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:

a first die layer comprising:

a first die and a second die laterally encapsulated with an encapsulant, the encapsulant having a topmost point contacting the first die, the first die and the second die having backside surfaces and active surfaces opposite of the backside surfaces, the active surface of the first die comprising a first conductive pad;

a first dielectric layer over the active surfaces of the first die and the second die and over the encapsulant, the first dielectric layer being a different material than the encapsulant;

a first redistribution layer extending along a top surface of the first dielectric layer and extending through the first dielectric layer to contact the first conductive pad; and a second die layer comprising:

a third die over the first dielectric layer and the first redistribution layer, the third die being laterally encapsulated with a second dielectric layer, the third die having a backside surface and an active surface opposite of the backside surface, the active surface comprising a second conductive pad, the second dielectric layer comprising a continuous material, the second dielectric layer contacting lateral sides and a top portion of the third die; and a second redistribution layer extending along a top surface of the second dielectric layer and extending through the second dielectric layer to physically contact the second conductive pad of the third die and the first redistribution layer.

2. The structure of claim 1, wherein the second dielectric layer and the encapsulant have a same material composition.

3. The structure of claim 1, wherein the second dielectric layer and the encapsulant have a different material composition.

4. The structure of claim 3, wherein the encapsulant includes a filler material, and wherein the second dielectric layer does not include the filler material.

5. The structure of claim 1, wherein the second redistribution layer comprises a seed layer, the seed layer having a lowermost surface below a bottom surface of the third die.

6. The structure of claim 1, further comprising:

a first connector disposed directly over the third die; and a second connector electrically coupled to the first die.

7. The structure of claim 1, further comprising an adhesive layer directly interposing the first dielectric layer and the third die.

8. A structure comprising:

a first die, the first die having a first conductive pad and a passivation layer;

an encapsulant encapsulating lateral edges of the first die, an uppermost surface of the encapsulant contacting an uppermost point of the passivation layer;

a first dielectric layer disposed over the first die and the encapsulant;

a first redistribution layer disposed over the first dielectric layer, the first redistribution layer comprising a first via extending through the first dielectric layer and contacting the first conductive pad;

a second die disposed over the first redistribution layer, the second die having a second conductive pad, a top surface of the first redistribution layer being more proximal than a bottom surface of the second die to the first dielectric layer;

a second dielectric layer disposed over a top surface of the second die, the second dielectric layer being a different material than the encapsulant; and a second redistribution layer disposed over the second dielectric layer, the second redistribution layer comprising a second via and a third via extending through the second dielectric layer, the second redistribution layer further comprising a level portion above an uppermost surface of the second dielectric layer, the second via and a portion of the level portion comprising a continuous material, the second redistribution layer being electrically coupled to the first redistribution layer and to the second conductive pad, the second via extending from a top surface of the second dielectric layer to the top surface of the first redistribution layer, the third via extending from the top surface of the second dielectric layer to the second conductive pad.

9. The structure of claim 8, wherein the encapsulant comprises a filler material.

10. The structure of claim 8, further comprising a first connector electrically coupled to the first die.

11. The structure of claim 10, wherein the first connector is electrically coupled to the first die by the second via.

12. The structure of claim 8, further comprising a second connector directly over the second die.

13. The structure of claim 12, wherein the second connector is electrically coupled to the second die by the third via.

14. The structure of claim 8, further comprising a third die laterally spaced from the first die, wherein the encapsulant encapsulates lateral edges of the third die.

15. A structure comprising:

a first die laterally spaced from a second die;

a molding material disposed around lateral edges of the first die and the second die, the molding material having an upper surface being recessed from a top surface of the first die, the upper surface of the molding material comprising a concave surface extending from the top surface of the first die;

a first dielectric layer disposed over the first die, the second die, and the molding material;

a first redistribution layer disposed over the first dielectric layer, the first redistribution layer extending through the first dielectric layer and electrically contacting the first die and the second die;

a third die disposed over the first redistribution layer;

a second dielectric layer disposed over and around lateral edges of the third die; and a second redistribution layer disposed over the second dielectric layer, the second redistribution layer comprising a first via and a second via, the first via and the second via extending through the second dielectric layer, the first via comprising a first seed layer and a first bulk film, the second via comprising a second seed layer and a second bulk film, the first seed layer physically contacting the first redistribution layer and a topmost surface of the second dielectric layer, the second seed layer physically contacting the third die and the topmost surface of the second dielectric layer.

16. The structure of claim 15, wherein the first die comprises a first contact pad and a passivation layer disposed over the first contact pad.

17. The structure of claim 15, wherein the molding material comprises a filler material.

18. The structure of claim 17, wherein the second dielectric layer comprises a different material than the molding material.

19. The structure of claim 15, further comprising:

a first external connector electrically coupled to the first die;

a second external connector electrically coupled to the second die; and a third external connector electrically coupled to the third die.

20. The structure of claim 19, wherein the first external connector is electrically coupled to the first die by the first via, and wherein the third external connector is electrically coupled to the third die by the second via.

* * * * *